United States Patent
Arashima et al.

(10) Patent No.: US 7,436,225 B2
(45) Date of Patent: Oct. 14, 2008

(54) SEMICONDUCTOR DEVICE HAVING OUTPUT TRANSISTOR AND CURRENT CONTROL CIRCUIT

(75) Inventors: Yoshinori Arashima, Gamagori (JP); Shouichi Okuda, Nukata-gun (JP)

(73) Assignee: Denso Corporation, Kariya (JP)

( * ) Notice: Subject to any disclaimer, the term of this patent is extended or adjusted under 35 U.S.C. 154(b) by 65 days.

(21) Appl. No.: 11/702,504

(22) Filed: Feb. 6, 2007

(65) Prior Publication Data

US 2007/0242407 A1 Oct. 18, 2007

(30) Foreign Application Priority Data

Apr. 17, 2006 (JP) .............................. 2006-113358
Nov. 9, 2006 (JP) .............................. 2006-304147

(51) Int. Cl.
  *H03B 1/00* (2006.01)
(52) U.S. Cl. ....................... 327/108; 327/109; 327/309; 327/312; 327/427; 361/56; 361/93.7
(58) Field of Classification Search ......... 327/108–111, 327/309–316, 379–381, 424, 427; 361/54, 361/56, 91.2, 93.7, 93.9
See application file for complete search history.

(56) References Cited

U.S. PATENT DOCUMENTS

| | | | |
|---|---|---|---|
| 5,528,128 A | * | 6/1996 | Melse ........................ 323/313 |
| 6,198,315 B1 | | 3/2001 | Nakano ...................... 327/110 |
| 6,573,693 B2 | * | 6/2003 | Okamoto ..................... 323/273 |

FOREIGN PATENT DOCUMENTS

| | | |
|---|---|---|
| EP | 0 827 266 B1 | 6/2001 |
| JP | A-2000-131369 | 5/2000 |
| JP | A-2005-86872 | 3/2005 |
| JP | A-2005-252968 | 9/2005 |

* cited by examiner

*Primary Examiner*—N. Drew Richards
*Assistant Examiner*—An T. Luu
(74) *Attorney, Agent, or Firm*—Posz Law Group, PLC

(57) ABSTRACT

A semiconductor device includes: a semiconductor substrate having first and second pads; an output transistor; and a current control circuit having first and second resistors, a control signal generation circuit, first and second switching circuits. The first or second resistor is disposed between the first or second pad and the output transistor. The control signal generation circuit generates a control signal to the output transistor based on a voltage of both ends of the first or second resistor. The first or second switching circuit is disposed between both ends of the first or second resistor and the control signal generation circuit. The first or second switching circuit is controlled to be in an on-state.

24 Claims, 17 Drawing Sheets

SEMICONDUCTOR DEVICE HAVING OUTPUT TRANSISTOR AND CURRENT CONTROL CIRCUIT

CROSS REFERENCE TO RELATED APPLICATIONS

This application is based on Japanese Patent Applications No. 2006-113358 filed on Apr. 17, 2006, and No. 2006-304147 filed on Nov. 9, 2006, the disclosures of which are incorporated herein by reference.

FIELD OF THE INVENTION

The present invention relates to a semiconductor device having an output transistor and a current control circuit.

BACKGROUND OF THE INVENTION

An air bag ECU (Electronic Control Unit) develops an air bag by flowing a constant electric current (e.g., an electric current of about 1 Ampere to 2 Amperes) for ignition to a squib when it is judged that a collision, etc. are caused in a vehicle. A constant electric current circuit for this air bag ignition can be constructed by a circuit similar to an overcurrent protecting circuit shown in, for example, JP-A-2005-252968. Concretely, as shown in FIG. 20, the constant electric current circuit is constructed as an IC having transistors T1 to T11, MOSFET M1, constant electric current circuit CC1 and shunt resistor Rs. Resistor RL in this figure equivalently shows electric characteristics of the squib as a load.

When an output electric current Io is flowed to resistor RL through shunt resistor Rs and MOSFET M1, an electric current ratio of transistors T7 and T8 is changed in accordance with a voltage between terminals of shunt resistor Rs. Transistors T9 and T10 constitute a current mirror circuit, and the same electric current as transistor T7 is flowed to this transistor T9. On the other hand, transistor T5 connected in series to transistor T10 outputs a constant electric current. As its result, the gate voltage of MOSFET M1 is controlled on the basis of the voltage between terminals of shunt resistor Rs, and output electric current Io is constantly controlled. A circuit for detecting the electric current by using the shunt resistor is disclosed in JP-A-10-75598 (corresponding to EP 0827266-B1), JP-A-2000-131369 and JP-A-2000-166279 (corresponding to U.S. Pat. No. 6,198,315).

In FIG. 20, when shunt resistor Rs is formed by wiring of aluminum, etc., the resistance value of shunt resistor Rs is dispersed by dispersion of sheet resistance, and the controlled constant electric current value is shifted from a target value. Further, the above constant electric current circuit performs no constant electric current operation if there is no predetermined electric potential difference between the terminals of shunt resistor Rs. Therefore, in an inspecting process after assembly of IC, a load electrically equivalent to the load connected at the real using time is connected, and the operation and the constant electric current value are confirmed. However, in a wafer inspecting process, the inspection is made by making a probe come in contact with a pad on a wafer. Therefore, when the electric current is increased (e.g., when the electric current exceeds several tens milliamperes to several hundreds milliamperes), it becomes difficult to make the inspection.

Thus, it is required for a semiconductor integrated circuit device to have sufficiently controlled electric current value and to make the inspection in the inspecting process before assembly even when a comparatively large electric current is controlled.

SUMMARY OF THE INVENTION

In view of the above-described problem, it is an object of the present disclosure to provide a semiconductor device having an output transistor and a current control circuit.

According to a first aspect of the present disclosure, a semiconductor device includes: a semiconductor substrate; an output transistor; and a current control circuit for controlling an output current of the output transistor. The current control circuit is disposed on the substrate. The substrate includes a first pad and a second pad. The current control circuit includes a first resistor, a second resistor, a control signal generation circuit, a first switching circuit, and a second switching circuit. The first resistor is disposed between the first pad and the output transistor. The second resistor is disposed between the second pad and the output transistor, and has a resistance higher than the first resistor. The control signal generation circuit generates a control signal to the output transistor based on one of a voltage of both ends of the first resistor and a voltage of both ends of the second resistor. The first switching circuit is disposed between both ends of the first resistor and the control signal generation circuit. The second switching circuit is disposed between both ends of the second resistor and the control signal generation circuit. The first switching circuit or the second switching circuit is controlled to be in an on-state.

When the device is tested in a device test process before the device is assembled, the first pad is opened, and a predetermined voltage is applied to the second. In this test process, the first switching circuit turns off, and the second switching circuit turns on. A current flows from the second pad to the output transistor through the second resistor. Thus, the voltage of both ends of the second resistor is inputted into the control signal generation circuit through the second switching circuit.

The control signal generation circuit controls the current flowing through the output transistor based on the voltage of the both ends of the second resistor. Since the second resistor has the resistance higher than the first resistor, the current control circuit can be operated with a comparative small current in the device test process. Thus, the operation of the device and the output current of the output transistor are determined in the device test process.

In an assembling process, the first pad is connected to, for example, a lead electrode of a lead frame with a bonding wire. Further, if necessary, the second pad is connected to the lead electrode or the like in order to adjust the resistance. In this case, the first switching circuit turns on, and the second switching circuit turns off. When only the first pad is connected to the lead electrode or the like, the current flows from the first pad to the output transistor through the first resistor. In addition, when the second pad is also connected to the lead electrode or the like, the current additionally flows from the second pad to the output transistor through the second resistor so that the first resistor and the second resistor are connected in parallel together.

The voltage of both ends of the first resistor or the voltage of the first resistor together with the second resistor is inputted into the control signal generation circuit through the first switching circuit, so that the control signal generation circuit controls the current flowing through the output transistor based on the inputted voltage. In this case, the resistance used for current control is changeable, i.e., the inputted voltage can be controlled, by connecting or disconnecting the second pad and the lead electrode or the like. Thus, the output current of the output transistor is adjusted.

Thus, the above device can be tested with a comparative small current, and can be used with a comparative large current. Further, the output current of the device is adjustable.

According to a second aspect of the present disclosure, a semiconductor device includes: a semiconductor substrate; an output transistor; and a current control circuit for controlling an output current of the output transistor. The current control circuit is disposed on the substrate. The substrate includes a first pad and a second pad. The current control circuit includes a first resistor, a second resistor, a control signal generation circuit, a first switching circuit and a second switching circuit. The first resistor is disposed between the first pad and the output transistor. The first resistor has a full voltage between both ends of the first resistor and a partial voltage between a middle portion of the first resistor and one end of the first resistor, the full voltage and the partial voltage being retrievable. The second resistor is disposed between the second pad and the output transistor, and has a resistance higher than the first resistor. The control signal generation circuit generates a control signal to the output transistor based on one of the full voltage or the partial voltage of the first resistor and a voltage of both ends of the second resistor. The first switching circuit includes a pad side first switching device, a middle portion first switching device, and an output transistor side first switching device. The pad side first switching device is disposed between a pad side first end of the first resistor and the control signal generation circuit. The middle portion first switching device is disposed between the middle portion of the first resistor and the control signal generation circuit. The output transistor side first switching device is disposed between an output transistor side first end of the first resistor and the control signal generation circuit. The second switching circuit is disposed between both ends of the second resistor and the control signal generation circuit. The pad side first switching device or the second switching circuit is controlled to be in an on-state. The output transistor side first switching device and the middle portion switching device are independently controlled to switch between an on-state and an off-state.

In the above device, in the in a device test process, the first pad is opened, and the predetermined test voltage is applied to the second pad. At this time, the first switching circuit turns off, and the second switching circuit turns on. The voltage of both ends of the second resistor is inputted into the control signal generation circuit through the second switching circuit. Thus, the current control circuit can be operated with a comparative small current in the device test process. Thus, the operation of the device and the output current of the output transistor are determined in the device test process.

In the assembling process, the first pad is connected to the lead electrode or the like. In this case, the pad side first switching device turns on, and the second switching circuit turns off. Further, the middle portion first switching device and/or the output transistor side first switching device selectively turn on if necessary. Thus, the full voltage or the partial voltage is inputted into the control signal generation circuit through the first switching circuit so that the control signal generation circuit controls the current flowing through the output transistor based on the inputted voltage. In this case, the resistance used for current control is changeable, i.e., the inputted voltage (i.e., the full voltage or the partial voltage) can be controlled, by switching the middle portion first switching device and/or the output transistor side first switching device. Thus, the output current of the output transistor is adjusted. In addition, the second pad may be connected to the lead electrode or the like. In this case, the first resistor and the second resistor are connected in parallel together, so that the current additionally flows from the second pad to the output transistor through the second resistor. The voltage of both ends of the first resistor or the voltage of the first resistor together with the second resistor is inputted into the control signal generation circuit through the first switching circuit, so that the output current of the output transistor is much adjusted.

Thus, the above device can be tested with a comparative small current, and can be used with a comparative large current. Further, the output current of the device is adjustable.

According to a third aspect of the present disclosure, a semiconductor device includes: a semiconductor substrate; an output transistor; and a current control circuit for controlling an output current of the output transistor. The current control circuit is disposed on the substrate. The substrate includes a pad. The current control circuit includes a first resistor, a second resistor, a control signal generation circuit, a first switching circuit and a second switching circuit. The first resistor and the second resistor are disposed in series between the pad and the output transistor. The second resistor has a resistance higher than the first resistor. The control signal generation circuit generates a control signal to the output transistor based on one of a voltage of both ends of the first resistor and a voltage of both ends of the second resistor. The first switching circuit is disposed between both ends of the first resistor and the control signal generation circuit. The second switching circuit is disposed between both ends of the second resistor and the control signal generation circuit. The first switching circuit or the second switching circuit is controlled to be in an on-state.

The above device can be tested with a comparative small current, and can be used with a comparative large current. Further, the output current of the device is adjustable.

According to a fourth aspect of the present disclosure, a semiconductor device includes: a semiconductor substrate; an output transistor; and a current control circuit for controlling an output current of the output transistor. The current control circuit is disposed on the substrate. The substrate includes a pad. The current control circuit includes a first resistor, a second resistor, and a control signal generation circuit. The first resistor and the second resistor are disposed in series between the pad and the output transistor. The second resistor has a resistance higher than the first resistor. The control signal generation circuit generates a control signal to the output transistor based on one of a voltage of both ends of the first resistor and a voltage of both ends of the second resistor. The control signal generation circuit includes: a first resistor side first transistor having a first terminal, a second terminal and a control terminal; a second resistor side first transistor having a first terminal, a second terminal and a control terminal; a first resistor side second transistor having a first terminal, a second terminal and a control terminal; a second resistor side second transistor having a first terminal, a second terminal and a control terminal; a third transistor having a first terminal, a second terminal and a control terminal; a fourth transistor having a first terminal, a second terminal and a control terminal; a first constant current circuit; a second constant current circuit; and a predetermined power source line. The first terminal of the first resistor side first transistor is coupled with a pad side first end of the first resistor. The first terminal of the second resistor side first transistor is coupled with a pad side second end of the second resistor. The first terminal of the first resistor side second transistor is coupled with an output transistor side first end of the first resistor. The first terminal of the second resistor side second transistor is coupled with an output transistor side second end of the second resistor. The control terminal of the first resistor side first transistor is coupled with the control terminal of the first resistor side second transistor. The control terminal of the second resistor side first transistor is coupled with the control terminal of the second resistor side second transistor. The first switching circuit is disposed between the first resistor side first transistor and the third transistor, and further, disposed between the first resistor side second transistor and the third transistor. The second switching circuit is disposed between the second resistor side first transistor and the fourth transistor, and further, disposed between the second resistor side second transistor and the fourth transistor. The first switching circuit or the second switching circuit is controlled to be in an on-state. The first terminal and the second terminal of the third transistor are coupled between the first switching circuit and the power source line. The control terminal of the third transistor is coupled with the control terminal of the fourth transistor. The first terminal and the second terminal of the fourth transistor are coupled between a control terminal of the output transistor and the power source line. The first constant current circuit is capable of flowing a first current to the first resistor side second transistor and the second resistor side second transistor. The second constant current circuit is capable of flowing a second current to the fourth transistor through the control terminal of the output transistor.

The above device can be tested with a comparative small current, and can be used with a comparative large current. Further, the output current of the device is adjustable.

According to a fifth aspect of the present disclosure, a semiconductor device includes: a semiconductor substrate; an output transistor; and a current control circuit for controlling an output current of the output transistor. The current control circuit is disposed on the substrate. The substrate includes a first pad and a second pad. The current control circuit includes a first resistor, a second resistor, and a control signal generation circuit. The first resistor is disposed between the first pad and the output transistor. The second resistor is disposed between the second pad and the output transistor, and has a resistance higher than the first resistor. The control signal generation circuit generates a control signal to the output transistor based on one of a voltage of both ends of the first resistor and a voltage of both ends of the second resistor. The control signal generation circuit includes: a first resistor side first transistor having a first terminal, a second terminal and a control terminal; a second resistor side first transistor having a first terminal, a second terminal and a control terminal; a first resistor side second transistor having a first terminal, a second terminal and a control terminal; a second resistor side second transistor having a first terminal, a second terminal and a control terminal; a third transistor having a first terminal, a second terminal and a control terminal; a fourth transistor having a first terminal, a second terminal and a control terminal; a first constant current circuit; a second constant current circuit; and a predetermined power source line. The first terminal of the first resistor side first transistor is coupled with a pad side first end of the first resistor. The first terminal of the second resistor side first transistor is coupled with a pad side second end of the second resistor. The first terminal of the first resistor side second transistor is coupled with an output transistor side first end of the first resistor. The first terminal of the second resistor side second transistor is coupled with an output transistor side second end of the second resistor. The control terminal of the first resistor side first transistor is coupled with the control terminal of the first resistor side second transistor. The control terminal of the second resistor side first transistor is coupled with the control terminal of the second resistor side second transistor. The first switching circuit is disposed between the first resistor side first transistor and the third transistor, and further, disposed between the first resistor side second transistor and the third transistor. The second switching circuit is disposed between the second resistor side first transistor and the fourth transistor, and further, disposed between the second resistor side second transistor and the fourth transistor. The first switching circuit or the second switching circuit is controlled to be in an on-state. The first terminal and the second terminal of the third transistor are coupled between the first switching circuit and the power source line. The control terminal of the third transistor is coupled with the control terminal of the fourth transistor. The first terminal and the second terminal of the fourth transistor are coupled between a control terminal of the output transistor and the power source line. The first constant current circuit is capable of flowing a first current to the first resistor side second transistor and the second resistor side second transistor. The second constant current circuit is capable of flowing a second current to the fourth transistor through the control terminal of the output transistor.

The above device can be tested with a comparative small current, and can be used with a comparative large current. Further, the output current of the device is adjustable.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
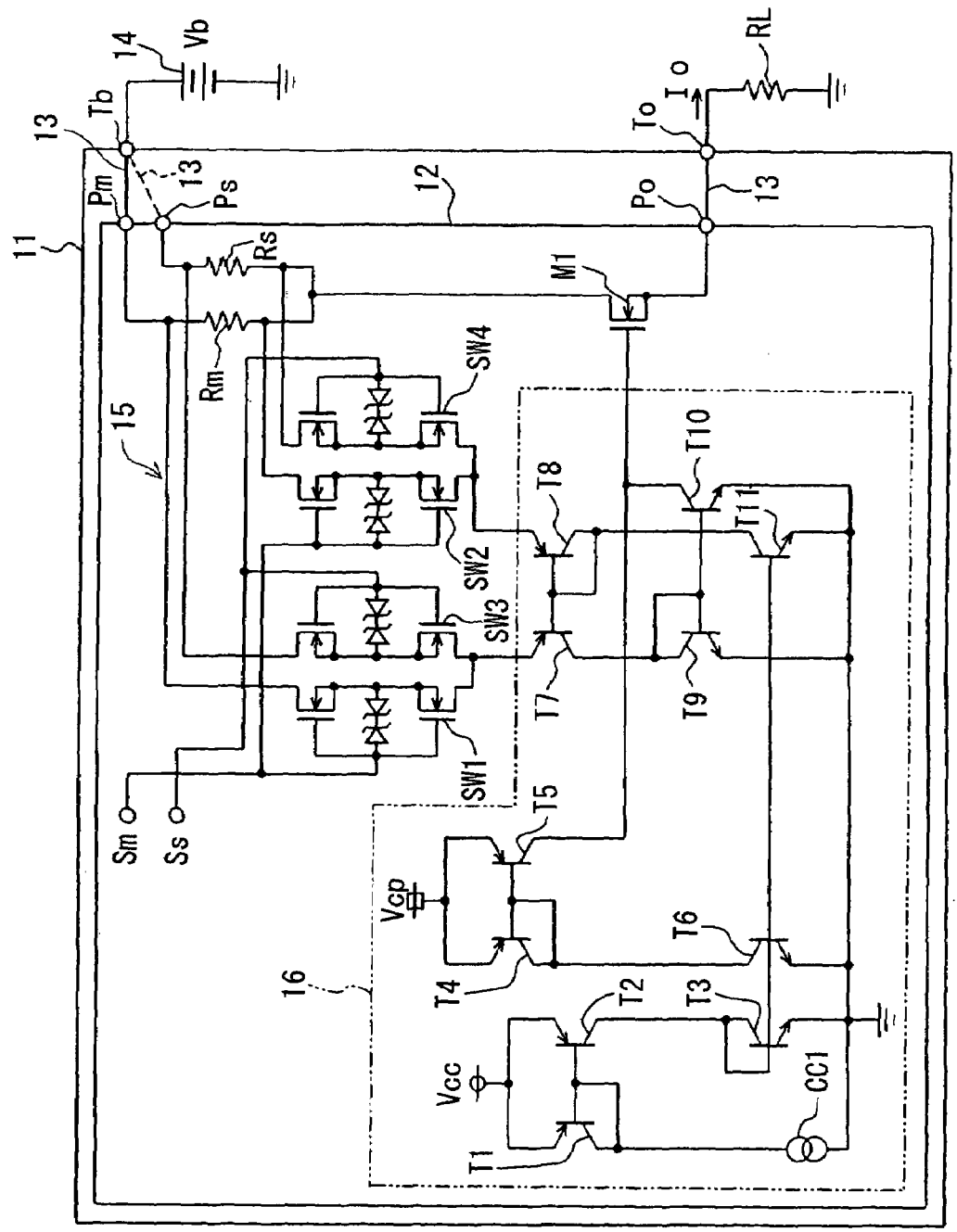
FIG. 1 is a circuit diagram showing a semiconductor integrated circuit device according to a first embodiment.

FIG. 1 shows the electric construction of an IC for air bag ignition having a constant electric current circuit. This IC 11 (semiconductor integrated circuit device) is arranged in an air bag ECU, and is operated so as to flow a constant electric current (e.g., an electric current of 1.4 Amperes as a target value) to a squib (which is equivalently shown by a symbol of resistance in FIG. 1 and is called load RL in the following description) to develop the air bag of a vehicle when an ignition command signal is inputted.

A chip 12 is mounted to a lead frame of manufactured IC 11. A bonding pad Pm (hereinafter called a pad) formed on this chip 12 and a lead electrode Tb of the lead frame, and a pad Po and a lead electrode To are respectively connected by bonding using a wire 13. Further, a pad Ps and the lead electrode Tb are also connected by the wire 13 in accordance with necessity to sufficiently adapt a constant electric current value as described later (shown by a broken line in FIG. 1). The lead electrode Tb of IC 11 is an electric power source terminal to which an electric power source voltage Vb is applied from an electric power source 14 such as a battery, etc. in the real using state of IC 11. The lead electrode To is an output terminal to which load RL is connected in the real using state. Further, pads Pm, Ps respectively correspond to first and second pads.

The above pads Pm, Ps, Po, MOSFET M1 (corresponding to an output transistor), an electric current control circuit 15, etc. are formed in the chip 12 (corresponding to a semiconductor substrate). MOSFET M1 of an N channel type is set to so-called high side connection, and its source is connected to pad Po. The electric current control circuit 15 controls a gate voltage of the above MOSFET M1, and is constructed from a control signal generating circuit 16, shunt resistors Rm, Rs and switch circuits SW1 to SW4.

Shunt resistor Rm (corresponding to a first resistor) is formed between pad Pm and the drain of MOSFET M1, and functions as an electric current detecting means in the real using state of IC 11. Shunt resistor Rs (corresponding to a second resistor) is formed between pad Ps and the drain of MOSFET M1, and functions as the electric current detecting means in a wafer inspection. When pad Ps and lead electrode Tb are connected in an assembly process, shunt resistor Rs attains a state connected in parallel with shunt resistor Rm, and also functions as the electric current detecting means in the real using state of IC 11. These shunt resistors Rm, Rs are formed by aluminum wiring.

Figure 2:
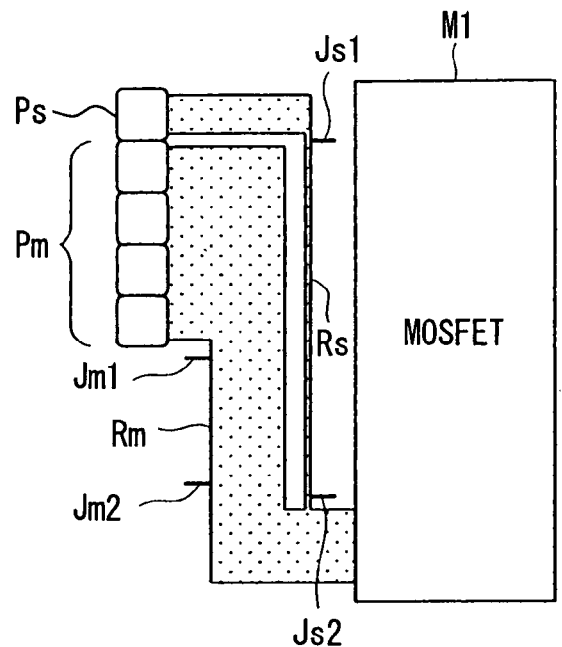
FIG. 2 is a schematic view showing layout of a pad and a shunt resistor according to the first embodiment.

FIG. 2 shows a layout example of pads Pm, Ps and shunt resistors Rm, Rs. Since a large electric current (e.g., 1.4 A) is flowed to pad Pm and shunt resistor Rm in the real using state of IC 11, the area of pad Pm and the pattern width of shunt resistor Rm are set so as to sufficiently flow the above electric current. In contrast to this, since only a small electric current (e.g., about 1.4 Amperes×Rm/Rs and Rm<Rs as described later) is flowed to pad Ps and shunt resistor Rs, the area of pad Ps and the pattern width of shunt resistor Rs are set to be comparatively small. The respective aluminum wiring patterns constituting shunt resistor Rm and shunt resistor Rs are arranged and formed in the same directions as forming directions of pads Pm, Ps. At their both ends, sensing terminals Jm1, Jm2 and sensing terminals Js1, Js2 are respectively formed.

The control signal generating circuit 16 shown in FIG. 1 is constructed from transistors T1 to T11 and a constant electric current circuit CC1, and generates the gate voltage (control signal) of MOSFET M1 on the basis of an inputted voltage (one of the voltage between both terminals of shunt resistor Rm and the voltage between both terminals of shunt resistor Rs). Voltage Vcc shown within this figure is a control voltage, and voltage Vcp is a raising voltage higher by a threshold voltage or more of MOSFET M1 than at least electric power source voltage Vb.

An output electric current of constant electric current circuit CC1 is returned by a current mirror circuit constructed by transistors T1, T2, and is flowed to transistors T3, T6, T11. The electric current flowed to transistor T6 is returned by a current mirror circuit constructed by transistors T4, T5, and is flowed to transistor T10. The collectors of transistors T5, T10 are connected to the gate of MOSFET M1, and transistors T5, T11 are respectively operated as a constant electric current circuit. The respective collectors of PNP type transistors T7, T8 having bases connected to each other are respectively connected to the ground through transistors T11, T9. The above transistors T9 and T10 constitute a current mirror circuit.

Switch circuits SW1, SW2 (corresponding to a first switch circuit) are respectively formed in signal paths from both terminals (sensing terminals Jm1, Jm2) of shunt resistor Rm to the respective emitters of transistors T7, T8 of the control signal generating circuit 16. Switch circuits SW3, SW4 (corresponding to a second switch circuit) are respectively formed in signal paths from both terminals (sensing terminals Js1, Js2) of shunt resistor Rs to the respective emitters of transistors T7, T8 of the control signal generating circuit 16.

These switch circuits SW1 to SW4 are constructed from two N channel MOSFETs connected in series and having gates connected to each other, and two Zener diodes connected in series so as to have polarities reverse to each other between their gates and sources. One MOSFET functions as a switch, and the other MOSFET functions as a back flow preventing diode. Signal Sm is given to the gate of MOSFET as control terminals of switch circuits SW1, SW2. Signal Ss is given to the gate of MOSFET as control terminals of switch circuits SW3, SW4.

The operation of this embodiment mode will next be explained.

At a wafer inspecting time of IC 11, signal Sm attains an L-level and signal Ss attains an H-level. Switch circuits SW1, SW2 are turned off, and switch circuits SW3, SW4 are turned on. At this time, a both-end voltage of shunt resistor Rs is inputted to the control signal generating circuit 16. In contrast to this, at the real using time of manufactured IC 11, signal Sm attains an H-level and signal Ss attains an L-level. Switch circuits SW1, SW2 are turned on and switch circuits SW3, SW4 are turned off. At this time, a both-end voltage of shunt resistor Rm is inputted to the control signal generating circuit 16. An unillustrated logic circuit formed on chip 12 outputs signals Sm, Ss of the above levels in accordance with an operating mode (normal mode and test mode).

In a wafer inspecting process, a probe connected to electric power source 14 is applied to pad Ps of chip 12, and a probe connected to load RL is applied to pad Po. At this time, electric current Io is flowed from electric power source 14 to load RL through pad Ps of chip 12, shunt resistor Rs, MOSFET M1 and pad Po. An adding voltage of the voltage between the base and the emitter of transistor T8 and the both-end voltage of shunt resistor Rs is applied between the base and the emitter of transistor T7. Therefore, when output electric current Io is increased, the collector electric currents of transistors T7, T9 are increased. In contrast to this, since transistor T5 continuously outputs a constant electric current, output electric current Io is increased and the collector electric potential of transistor T10, i.e., the gate electric potential of MOSFET M1 is lowered. Constant electric current control is performed so as to constantly set the voltage between the terminals of shunt resistor Rs.

Since the resistance value of shunt resistor Rs is set to be higher than the resistance value of shunt resistor Rm used in the real using state of IC 11, output electric current Ios in the wafer inspection becomes Rm/Rs (<1) times output electric current Iom (1.4 A) in the real using state. As its result, the electric current control circuit 15 can be normally operated even in the electric current (e.g., several ten mA to several hundred mA) able to be flowed by a probe tester, and the operation of chip 12 and the output electric current value can be confirmed in the wafer inspection.

When the output electric current value measured in this wafer inspecting process is compared with the electric current value on design, it is possible to presume a shift (dispersion) of the resistance value of shunt resistor Rs in a manufacturing process of the IC 11, in its turn, shunt resistor Rm. When it is judged that the resistance value of shunt resistor Rm is equal to a target value (design value), pad Pm and lead electrode Tb are connected and pad Ps is opened in a subsequent assembly process. In contrast to this, when it is judged that the resistance value of shunt resistor Rm is higher than the target value (design value), pad Pm and lead electrode Tb, and pad Ps and lead electrode Tb are respectively connected in the subsequent assembly process.

As its result, at the real using time of manufactured IC 11, electric current Io is flowed from electric power source 14 to load RL through lead electrode Tb, pad Pm of chip 12, shunt resistor Rm, MOSFET M1, pad Po and lead electrode To. Further, when pad Ps and lead electrode Tb are connected, electric current Io is flowed from electric power source 14 to load RL through lead electrode Tb, pad Ps of chip 12, shunt resistor Rs, MOSFET M1, pad Po and lead electrode To. A constant electric current operation using the control signal generating circuit 16 is similar to the operation in the above wafer inspection.

When pad Ps and lead electrode Tb are connected, it attains a state in which shunt resistors Rm and Rs are connected in parallel. Accordingly, one of Rm and Rm·Rs/(Rm+Rs) can be selected as the resistance value of the shunt resistor by the existence or nonexistence of connection of pad Ps and lead electrode Tb. Accordingly, output electric current Io of IC 11 can be adjusted to (1+Rm/Rs) times by the existence or nonexistence of connection of pad Ps and lead electrode Tb.

As explained above, shunt resistor Rs having a resistance value higher than that of shunt resistor Rm used at the real using time is formed in chip 12 of IC 11 of this embodiment mode. In the wafer inspecting process, constant electric current control is performed by using the both-end voltage of shunt resistor Rs. Accordingly, the constant electric current operation and the output electric current value can be confirmed by a comparatively small electric current able to appropriately execute the wafer inspection.

Further, shunt resistor Rs is also utilized in an adjustment of the output electric current value. Namely, in the assembly process, lead electrode Tb and pad Pm connected to shunt resistor Rm are connected and the existence or nonexistence of connection of lead electrode Tb and pad Ps connected to shunt resistor Rs is then further selected. Thus, the resistance value of the shunt resistor can be adjusted to two stages so that the output electric current value can be sufficiently adapted. Thus, an air bag can be more reliably developed in accordance with an ignition command signal.

Respective aluminum wiring patterns constituting shunt resistor Rm and shunt resistor Rs are mutually arranged and formed in the same direction. Accordingly, the shifts of both the resistance values in the manufacturing process of IC 11 have the same tendency. Accordingly, it is possible to presume the shift of the resistance value of shunt resistor Rm on the basis of the shift of the resistance value of shunt resistor Rs presumed from a result of the wafer inspection, and the output electric current value can be reliably sufficiently adapted in the assembly process.

A pair of sensing terminals Jm1, Jm2 and a pair of sensing terminals Js1, Js2 are respectively formed at respective both terminals of shunt resistor Rm and shunt resistor Rs. Switch circuits SW1, SW2 are respectively formed in signal paths from sensing terminals Jm1, Jm2 to the control signal generating circuit 16. Switch circuits SW3, SW4 are respectively formed in signal paths from sensing terminals Js1, Js2 to the control signal generating circuit 16. Thus, since the signal paths from the respective both terminals of shunt resistors Rm, Rs to the control signal generating circuit 16 are constructed by electrical symmetric circuits, no voltage error is easily caused in these signal paths even when the voltages between the terminals of shunt resistors Rm, Rs are small voltages.

Second Embodiment Mode

Figure 4:
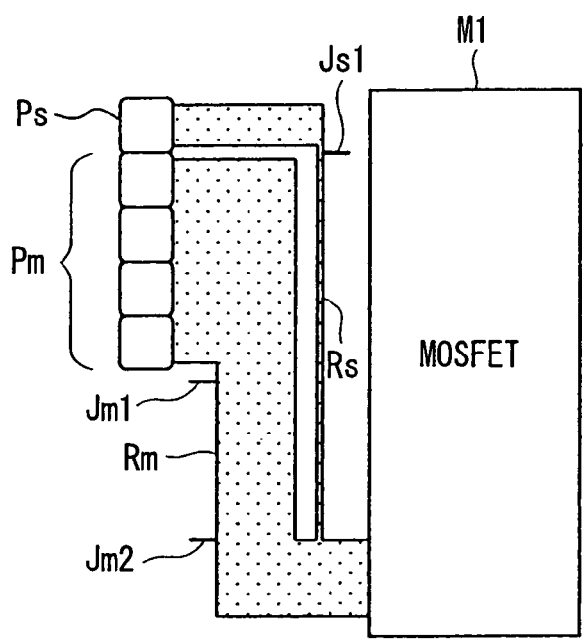
FIG. 4 is a schematic view showing layout of a pad and a shunt resistor according to the second embodiment.
Figure 3:
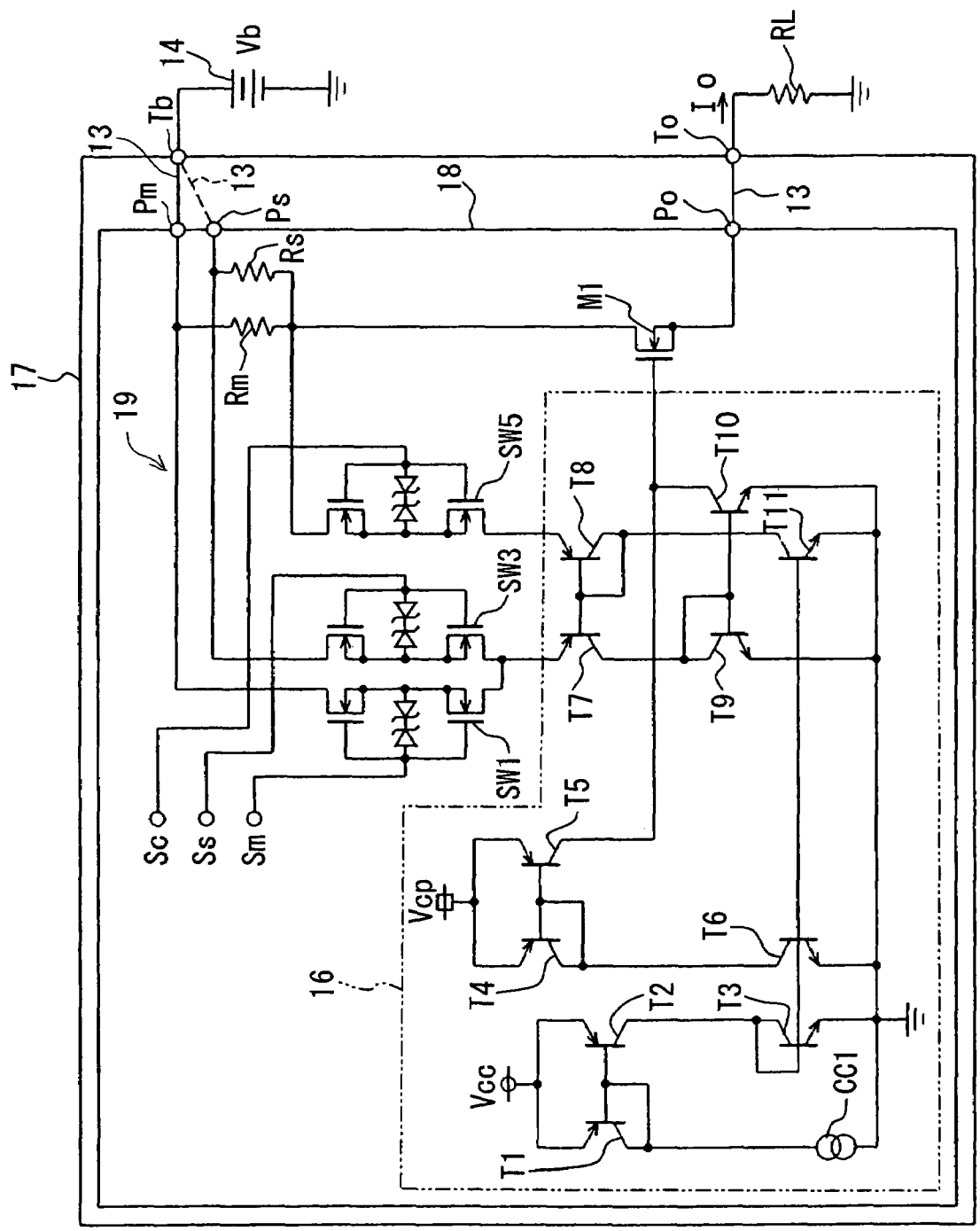
FIG. 3 is a circuit diagram showing a semiconductor integrated circuit device according to a second embodiment.

In an electric current control circuit 19 formed in a chip 18 of IC 17, terminals of MOSFET M1 side of shunt resistors Rm and Rs are electrically connected. Therefore, as shown in FIGS. 3 and 4, sensing terminal Js2 is omitted, and one commonized switch circuit SW5 (corresponding to first and second switch circuits) is formed in a signal path from sensing terminal Jm2 to the emitter of transistor T8 of the control signal generating circuit 16. This switch circuit SW5 is turned on at the wafer inspecting time of IC 17 and the real using time after manufacture.

In FIG. 2, sensing terminals Jm2, Js2 are formed in positions slightly shifted on the pad side from terminal positions of the respective aluminum wiring patterns (joining positions of both the aluminum wiring patterns arranged in parallel) forming shunt resistors Rm, Rs. In contrast to this, in FIG. 4, sensing terminal Jm2 is formed in a joining portion of the above aluminum wiring to reduce an error due to commonization of sensing terminals Jm2, Js2. In accordance with this embodiment mode, the number of switch circuits formed in the chip 18 can be reduced while a resistance error of shunt resistors Rm, Rs is extremely restrained.

Third Embodiment Mode

Figure 5:
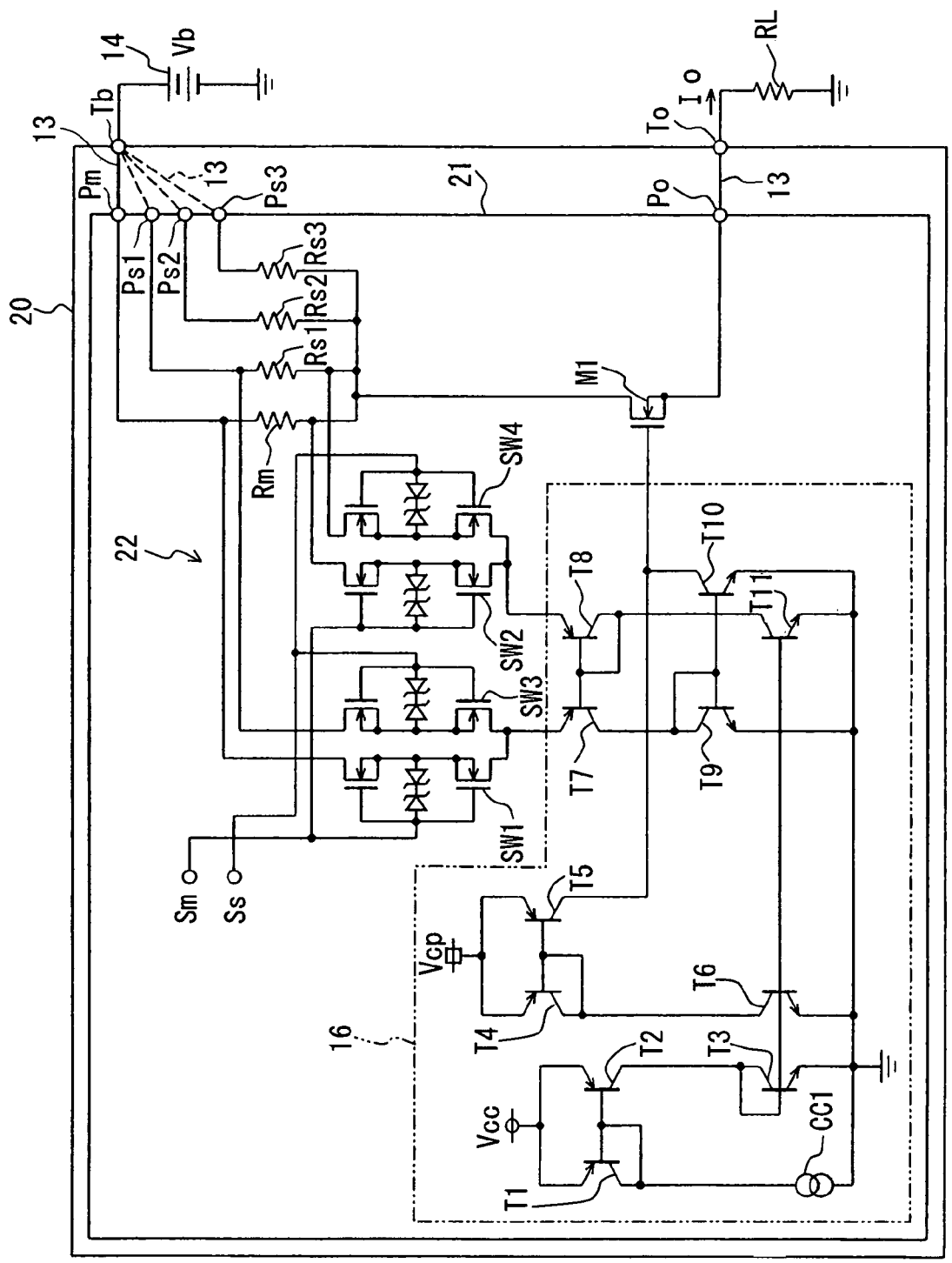
FIG. 5 is a circuit diagram showing a semiconductor integrated circuit device according to a third embodiment.
Figure 6:
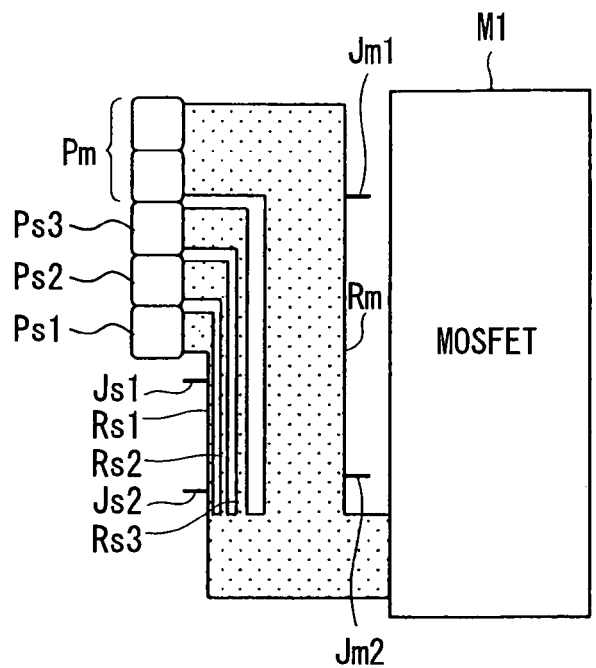
FIG. 6 is a schematic view showing layout of a pad and a shunt resistor according to the third embodiment.

Three pads Ps1, Ps2, Ps3 are formed as a second pad in a chip 21 of IC 20, as shown in FIGS. 5 and 6. In an electric current control circuit 22, shunt resistors Rs1, Rs2, Rs3 (corresponding to a second resistor) are respectively formed between these respective pads Ps1, Ps2, Ps3 and the drain of MOSFET M1. The resistance values of shunt resistors Rs1, Rs2, Rs3 are set to be higher than the resistance value of shunt resistor Rm.

As shown in FIG. 6, respective aluminum wiring patterns constituting shunt resistor Rm and shunt resistors Rs1, Rs2, Rs3 are arranged and formed in the same directions as forming directions of pads Pm, Ps1, Ps2, Ps3. Sensing terminals Js1, Js2 are formed at both ends of shunt resistor Rs1. Switch circuits SW3, SW4 are respectively formed in signal paths from both terminals (sensing terminals Js1, Js2) of shunt resistor Rs1 to the respective emitters of transistors T7, T8 of the control signal generating circuit 16.

In the wafer inspecting process, similar to the first embodiment mode, the operation of the chip 21 and the output electric current value are confirmed. Namely, signal Sm attains an L-level, and signal Ss attains an H-level. Switch circuits SW1, SW2 are turned off, and switch circuits SW3, SW4 are turned on. A probe connected to the electric power source 14 is applied to pad Ps1 of chip 21, and a probe connected to load RL is applied to pad Po. Thus, electric current Io is flowed from the electric power source 14 to load RL through pad Ps1 of chip 21, shunt resistor Rs1, MOSFET M1 and pad Po.

It is possible to presume the shift (dispersion) of the resistance value of shunt resistor Rs1, in its turn, shunt resistors Rs2, Rs3, Rm on the basis of the output electric current value measured in this wafer inspecting process. When it is judged that the resistance value of shunt resistor Rm is equal to a target value (design value), pad Pm and lead electrode Tb are connected and pads Ps1, Ps2, Ps3 are opened in the subsequent assembly process.

In contrast to this, when it is judged that the resistance value of shunt resistor Rm is higher than the target value (design value), pad Pm and lead electrode Tb are connected in the subsequent assembly process, and pads Ps1, Ps2, Ps3 and lead electrode Tb are respectively connected in accordance with the shift of the resistance value (shown by a broken line in FIG. 5). When it is supposed that all the resistance values of shunt resistors Rs1, Rs2, Rs3 are Rs, the resistance value of the shunt resistor of the electric current control circuit 22 becomes one of Rm, Rm·Rs/(Rm+Rs), Rm·Rs/(2·Rm+Rs), and Rm·Rs/(3·Rm+Rs) in accordance with the existence or nonexistence of each connection of the above pads Ps1, Ps2, Ps3 and lead electrode Tb.

In accordance with this embodiment mode, plural pads Ps1, Ps2, Ps3 and plural shunt resistors Rs1, Rs2, Rs3 are formed. Accordingly, the resistance value of the shunt resistor can be changed to four stages and the output electric current value can be sufficiently adapted with higher precision by selecting the existence or nonexistence of each connection of these pads Ps1, Ps2, Ps3 and lead electrode Tb at the assembly time. If the resistance values of shunt resistors Rs1, Rs2, Rs3 are set to values different from each other, the output electric current value can be sufficiently adapted with further higher precision. In addition, operations and effects similar to those of the first embodiment mode can be obtained.

Fourth Embodiment Mode

Figure 8:
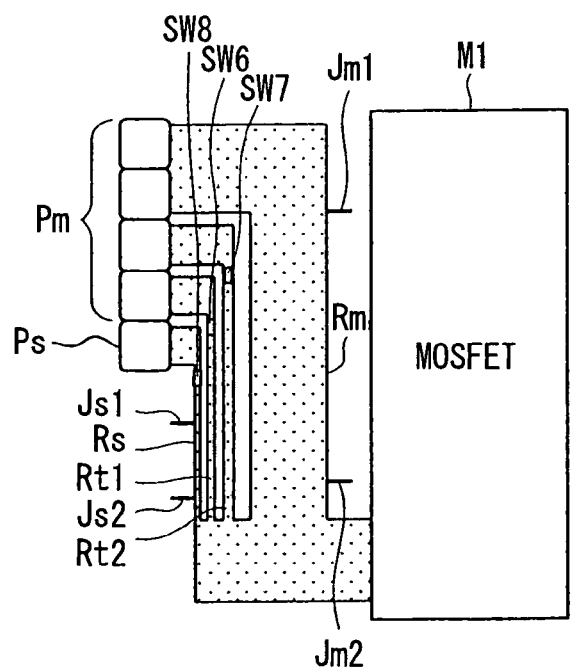
FIG. 8 is a schematic view showing layout of a pad and a shunt resistor according to the fourth embodiment.
Figure 7:
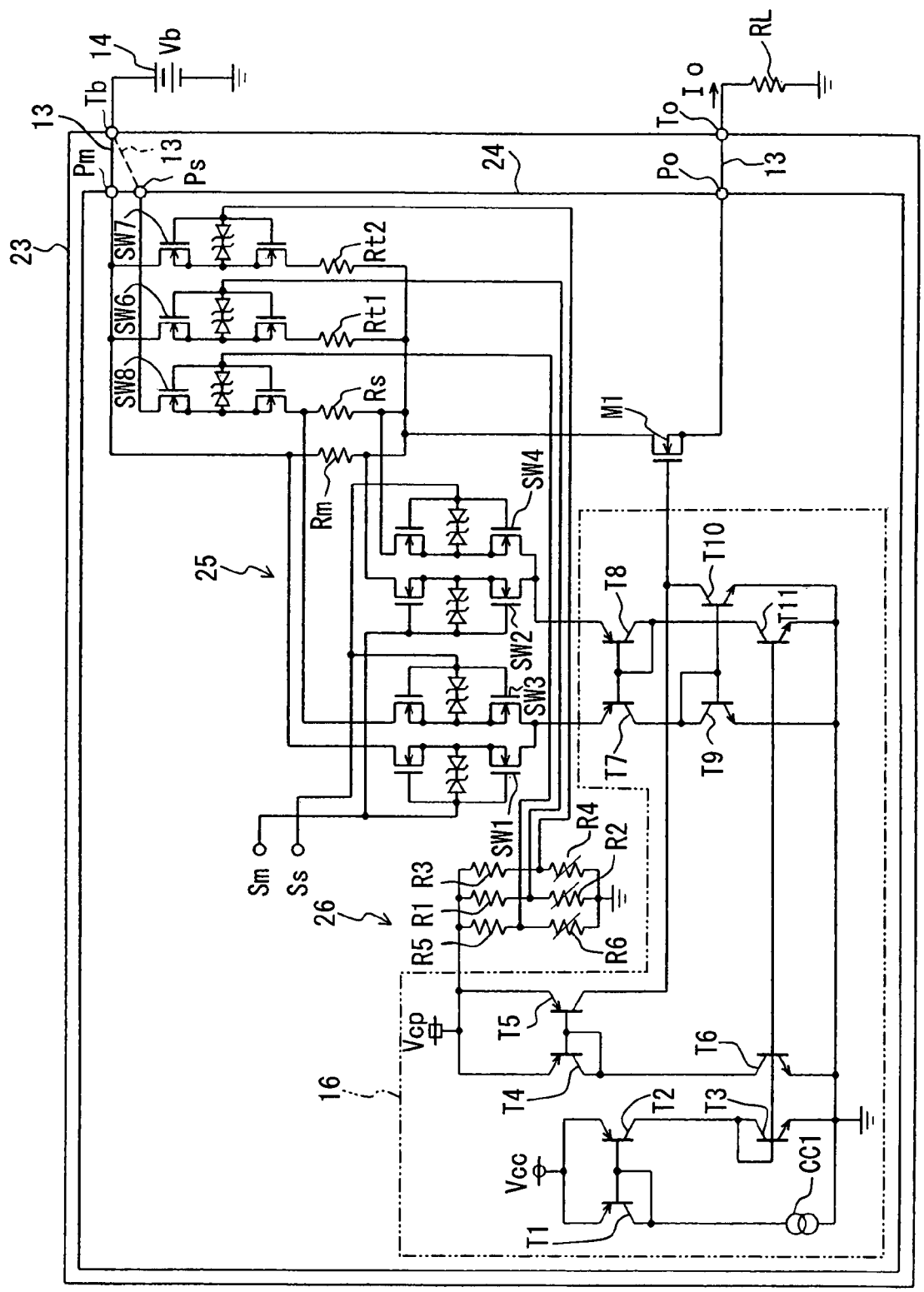
FIG. 7 is a circuit diagram showing a semiconductor integrated circuit device according to a fourth embodiment.

As shown in FIGS. 7 and 8, in an electric current control circuit 25 formed in a chip 24 of IC 23, a series circuit of switch circuit SW6 and shunt resistor Rt1, and a series circuit of switch circuit SW7 and shunt resistor Rt2 are respectively connected between pad Pm and the drain of MOSFET M1. Further, switch circuit SW8 and shunt resistor Rs are connected in series between pad Ps and the drain of MOSFET M1. As shown in FIG. 8, respective aluminum wiring patterns constituting shunt resistor Rm and shunt resistors Rs, Rt1, Rt2 are arranged and formed in the same directions as forming directions of pads Pm, Ps. Switch circuits SW8, SW6, SW7 are respectively formed in end portions of shunt resistors Rs, Rt1, Rt2.

Shunt resistors Rt1, Rt2 correspond to a third resistor, and have a resistance value higher than that of shunt resistor Rm, e.g., the same resistance value as shunt resistor Rs corresponding to a second resistor. Switch circuits SW6, SW7 correspond to a third switch circuit, and switch circuit SW8 corresponds to a fourth switch circuit. These switch circuits SW6 to SW8 have constructions similar to those of the above switch circuits SW1 to SW4.

A series circuit of resistor R1 and trimming resistor R2, a series circuit of resistor R3 and trimming resistor R4, and a series circuit of resistor R5 and trimming resistor R6 are respectively connected between a supply line of raising voltage Vcp and the ground. Common connection points of resistors in the respective series circuits are respectively connected to control terminals of switch circuits SW6, SW7, SW8. A resistance circuit 26 (corresponding to a selecting circuit) is constructed by these resistors R1 to R6.

At the wafer inspecting time, similar to the first embodiment mode, a probe connected to the electric power source 14 is applied to pad Ps of chip 24, and a probe connected to load RL is applied to pad Po. Signal Sm attains an L-level and signal Ss attains an H-level. Switch circuits SW1, SW2 are turned off and switch circuits SW3, SW4 are turned on. Since trimming resistor R6 is disconnected before the wafer inspection, switch circuits SW6, SW7 are turned off, and switch circuit SW8 is turned on. Thus, electric current Io is flowed from the electric power source 14 to load RL through pad Ps of chip 24, switch circuit SW8, shunt resistor Rs, MOSFET M1 and pad Po.

A shift (dispersion) of the resistance value of shunt resistor Rs, in its turn, shunt resistors Rm, Rt1, Rt2 can be presumed on the basis of an output electric current value measured in this wafer inspecting process. When it is judged that the resistance value of shunt resistor Rm is equal to a target value (design value), trimming resistors R2, R4 are not disconnected but are maintained. In the subsequent assembly process, pad Pm and lead electrode Tb are connected, and pad Ps is opened. As its result, only shunt resistor Rm is used as an electric current detecting means at the real using time.

In contrast to this, when it is judged that the resistance value of shunt resistor Rm is higher than the target value (design value), one or both of trimming resistors R2, R4 are disconnected, and pad Pm and lead electrode Tb are connected in the subsequent assembly process. Thus, one or both of switch circuits SW6, SW7 are turned on at the real using time, and the shunt resistor used as the electric current detecting means becomes a parallel circuit of shunt resistors Rm and Rt1 (or Rt2), or a parallel circuit of shunt resistors Rm, Rt1 and Rt2. Further, if pad Ps and lead electrode Tb are connected, the shunt resistor used as the electric current detecting means at the real using time becomes a parallel circuit of shunt resistors Rm, Rt1, Rt2 and Rs.

In accordance with this embodiment mode, the resistance value of the shunt resistor can be changed to four stages and the output electric current value can be sufficiently adapted with higher precision by selecting on-off states of switch circuits SW6, SW7 and the existence or nonexistence of connection of pad Ps and lead electrode Tb. If the resistance values of shunt resistors Rs, Rt1, Rt2 are set to values different from each other, the output electric current value can be sufficiently adapted with further higher precision. Further, a series circuit of resistor R5 in switch circuit SW8 and resistance circuit 26, and trimming resistor R6 may be also omit-

Fifth Embodiment Mode

Figure 9:
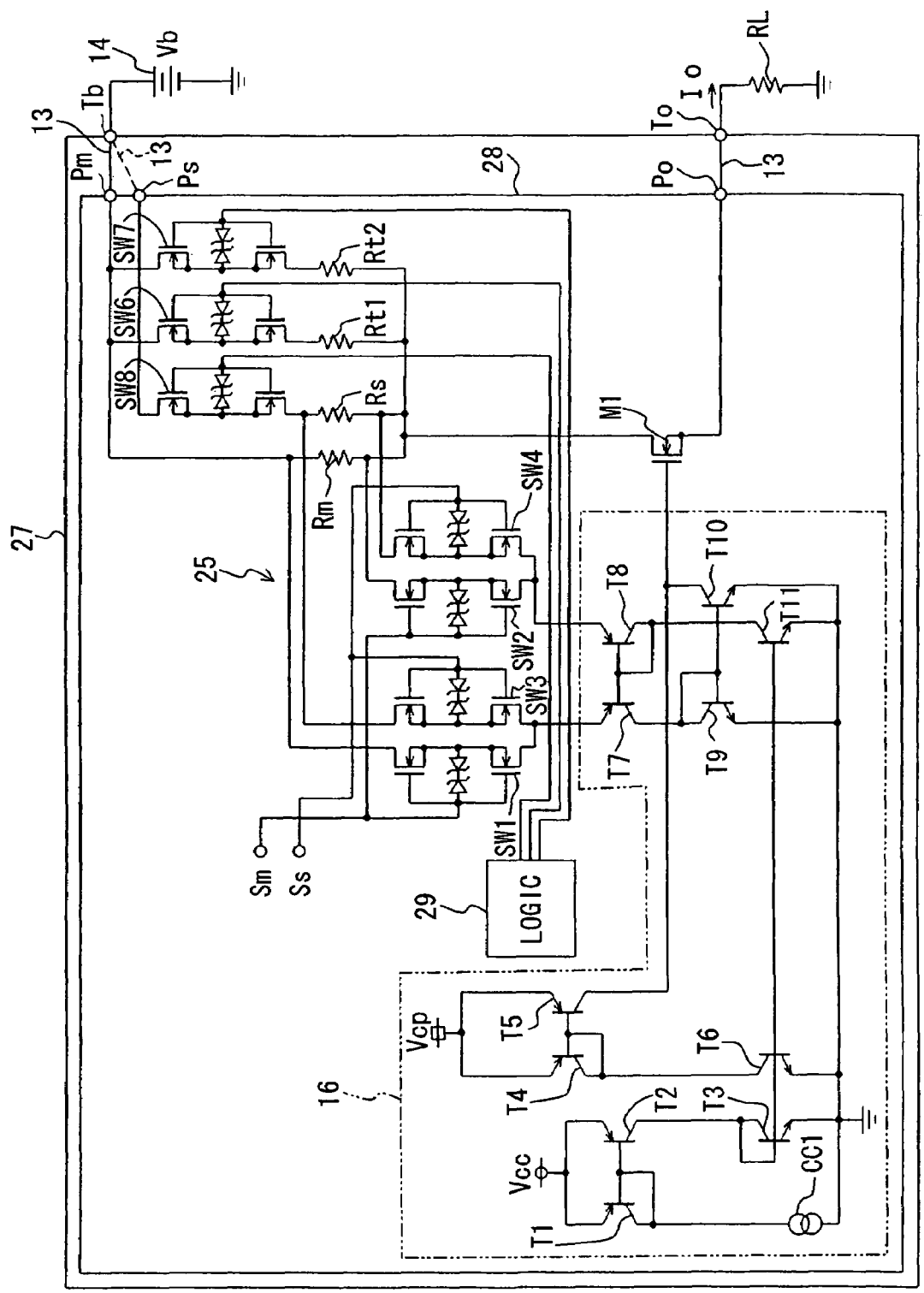
FIG. 9 is a circuit diagram showing a semiconductor integrated circuit device according to a fifth embodiment.

FIG. 9 shows a fifth embodiment mode. A logic portion 29 (corresponding to a selecting circuit) is formed instead of the resistance circuit 26 in a chip 28 of IC 27. This logic portion 29 is constructed from a nonvolatile memory able to be electrically rewritten. An on-off command state of switch circuits SW6 to Sw8 is stored to the logic portion 29. Switch circuits SW6 to SW8 are turned on and off by an on-off command signal outputted from the logic portion 29 in accordance with its stored data.

Before the wafer inspection, data for respectively turning off, off and on switch circuits SW6, SW7, SW8 are stored to the logic portion 29, and the wafer inspection is made in a turning-on state of switch circuit SW8. As a result of this wafer inspection, when it is judged that the resistance value of shunt resistor Rm is equal to a target value (design value), pad Pm and lead electrode Tb are connected and pad Ps is opened in the subsequent assembly process. Further, all data of switch circuits SW6 to SW8 of the logic portion 29 are set to off (data at the wafer inspecting time may be also set as they are). As its result, only shunt resistor Rm is used as the electric current detecting means at the real using time.

In contrast to this, when it is judged that the resistance value of shunt resistor Rm is higher than the target value (design value), pad Pm and lead electrode Tb are connected in the subsequent assembly process. Then, one or both of the data of switch circuits SW6, SW7 of the logic portion 29 are set to on, and the data of switch circuit SW8 are set to off. Thus, the shunt resistor used as the electric current detecting means at the real using time becomes a parallel circuit of shunt resistors Rm and Rt1 (or Rt2), or a parallel circuit of shunt resistors Rm, Rt1 and Rt2. Further, if pad Ps and lead electrode Tb are connected and the data of switch circuit SW8 of the logic portion 29 are set to on, the shunt resistor used as the electric current detecting means at the real using time becomes a parallel circuit of shunt resistors Rm, Rt1, Rt2 and Rs. In accordance with this embodiment mode, operations and effects similar to those of the fourth embodiment mode are also obtained.

Sixth Embodiment Mode

Figure 10:
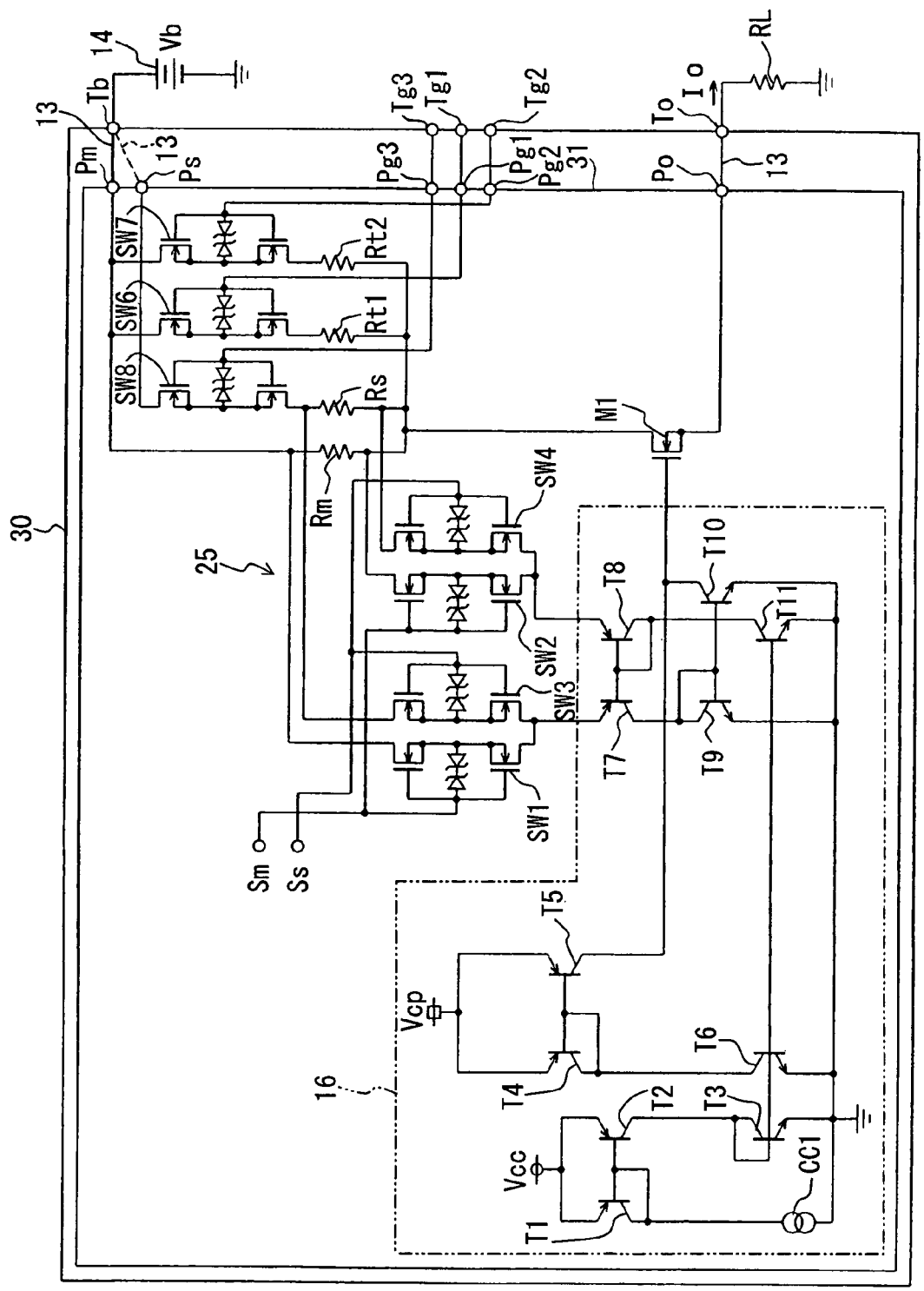
FIG. 10 is a circuit diagram showing a semiconductor integrated circuit device according to a sixth embodiment.

FIG. 10 shows a sixth embodiment mode. Switch circuits SW6 to SW8 formed in a chip 31 of IC 30 are set to be controlled by an on-off command signal given from the exterior of IC 30. Pads Pg1, Pg2, Pg3 and lead electrodes Tg1, Tg2, Tg3 are arranged to input the above on-off command signal, and are respectively connected by wire bonding. In accordance with this embodiment mode, similar to the fourth and fifth embodiment modes, the output electric current value can be also sufficiently adapted with high precision.

Seventh Embodiment Mode

Figure 11:
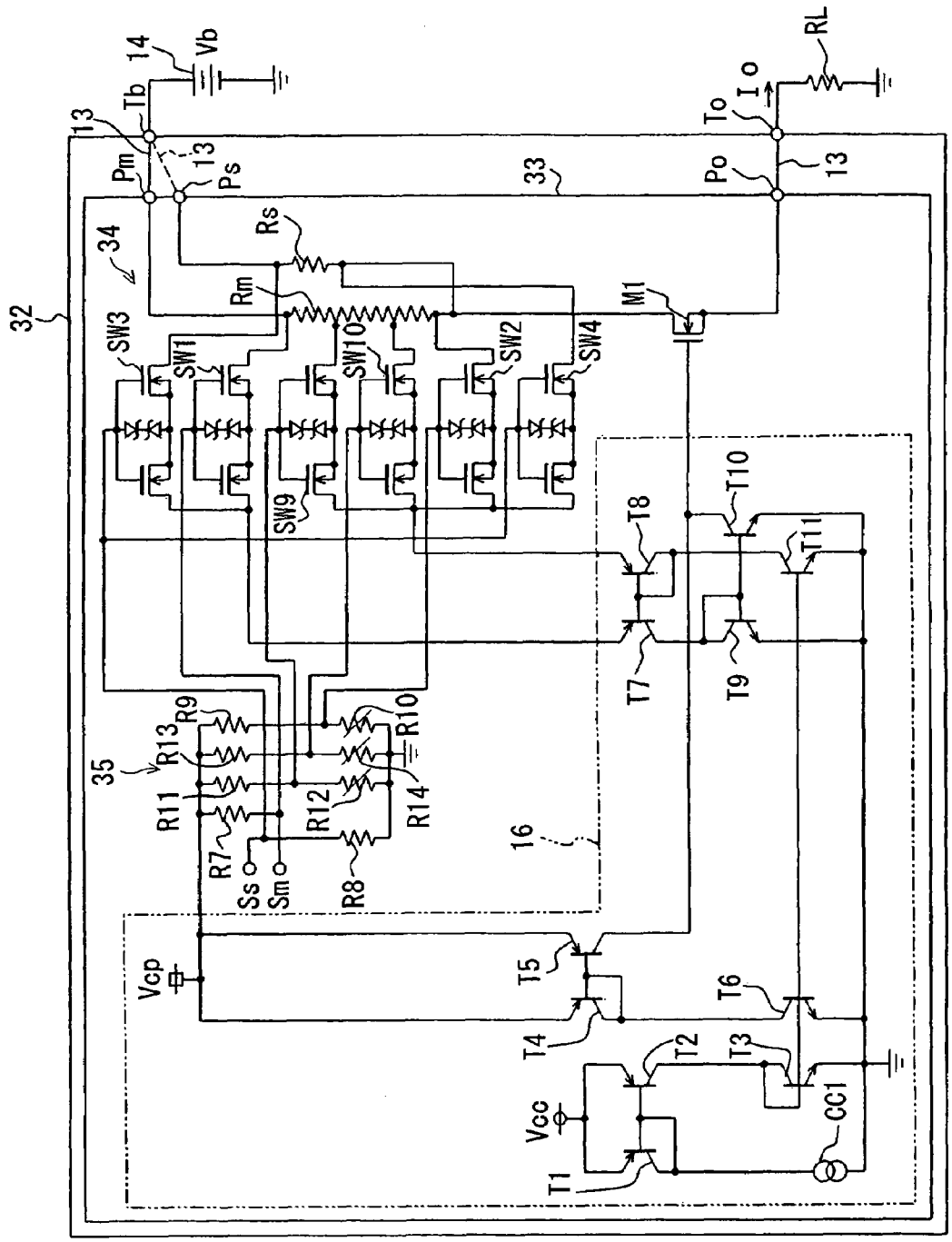
FIG. 11 is a circuit diagram showing a semiconductor integrated circuit device according to a seventh embodiment.
Figure 12:
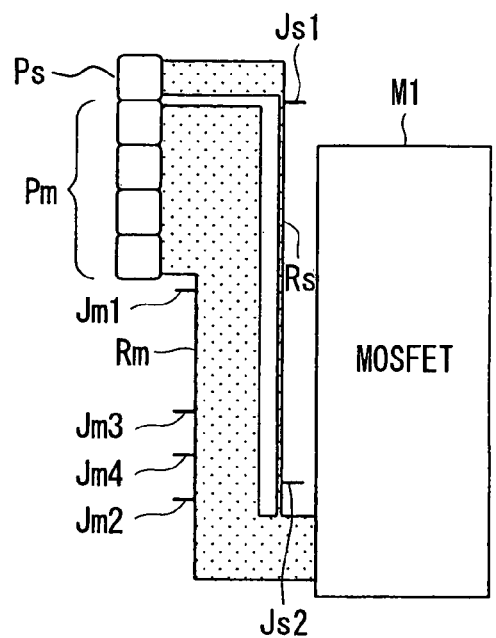
FIG. 12 is a schematic view showing layout of a pad and a shunt resistor according to the seventh embodiment.

FIGS. 11 and 12 respectively correspond to FIGS. 1 and 2. As already described, switch circuits SW1, SW2 are respectively formed in signal paths from both terminals (sensing terminals Jm1, Jm2) of shunt resistor Rm to the respective emitters of transistors T7, T8 of the control signal generating circuit 16 in an electric current control circuit 34 formed in a chip 33 of IC 32. Switch circuits SW3, SW4 are respectively formed in signal paths from both terminals (sensing terminals Js1, Js2) of shunt resistor Rs to the respective emitters of transistors T7, T8. A control terminal of switch circuit SW1 is pulled up by resistor R7, and signal Sm is given to this control terminal. Control terminals of switch circuits SW3, SW4 are pulled down by resistor R8, and signal Ss is given to these control terminals.

As shown in FIG. 12, sensing terminals Jm3, Jm4 are formed in intermediate positions of both terminals of shunt resistor Rm constructed by an aluminum wiring pattern. Switch circuits SW9, SW10 (corresponding to a first switch circuit) are respectively formed in signal paths from these sensing terminals Jm3, Jm4 to the emitter of transistor T8. The operations of switch circuits SW2, SW9, SW10 are controlled by an on-off command signal outputted from a resistance circuit 35.

The resistance circuit 35 (corresponding to a selecting circuit) is constructed from resistor R9 and trimming resistor R10, resistor R11 and trimming resistor R12, and resistor R13 and trimming resistor R14 respectively connected in series between a supply line of raising voltage Vcp and the ground. Common connection points of resistors in the respective series circuits are respectively connected to control terminals of switch circuits SW2, SW9, SW10.

At the wafer inspecting time, similar to the first embodiment mode, a probe connected to the electric power source 14 is applied to pad Ps of chip 33, and a probe connected to load RL is applied to pad Po. Signal Sm attains an L-level and signal Ss attains an H-level. Trimming resistors R10, R12, R14 are not disconnected but are maintained. Accordingly, switch circuits SW1, SW2, SW9, SW10 are turned off, and switch circuits SW3, SW4 are turned on. Thus, electric current Io is flowed from the electric power source 14 to load RL through pad Ps of chip 33, shunt resistor Rs, MOSFET M1 and pad Po.

A shift (dispersion) of the resistance value of shunt resistor Rs, in its turn, shunt resistor Rm can be presumed on the basis of an output electric current value measured in this wafer inspecting process. In accordance with this result, one of trimming resistors R10, R12, R14 is selectively disconnected. In the subsequent assembly process, pad Pm and lead electrode Tb are connected, and pad Ps is opened. As its result, at the real using time of IC 32, one of switch circuit SW1 and switch circuits SW2, SW9, SW10 is turned on, and the resistance value of shunt resistor Rm used as the electric current detecting means can be changed to three stages. Further, pad Ps and lead electrode Tb may be also further connected in the assembly process to lower the resistance value of the shunt resistor. Thus, the shunt resistor used as the electric current detecting means at the real using time becomes a parallel circuit of shunt resistors Rm and Rs.

As explained above, shunt resistor Rm able to change the resistance value for functioning as the electric current detecting means, and shunt resistor Rs having a resistance value higher than that of this shunt resistor Rm are formed in the chip 33 of IC 32 of this embodiment mode. In the wafer inspecting process, constant electric current control is performed by using the both-end voltage of shunt resistor Rs. Accordingly, the constant electric current operation and the output electric current value can be confirmed by a comparatively small electric current able to appropriately execute the wafer inspection.

Further, the resistance value of the shunt resistor at the real using time can be stepwise adjusted by selectively turning-on switch circuits SW2, SW9, SW10 and changing a voltage taking-out position from shunt resistor Rm so that the output electric current value can be sufficiently adapted. In addition, operations and effects similar to those of the first embodiment mode are obtained.

Eighth Embodiment Mode

Figure 13:
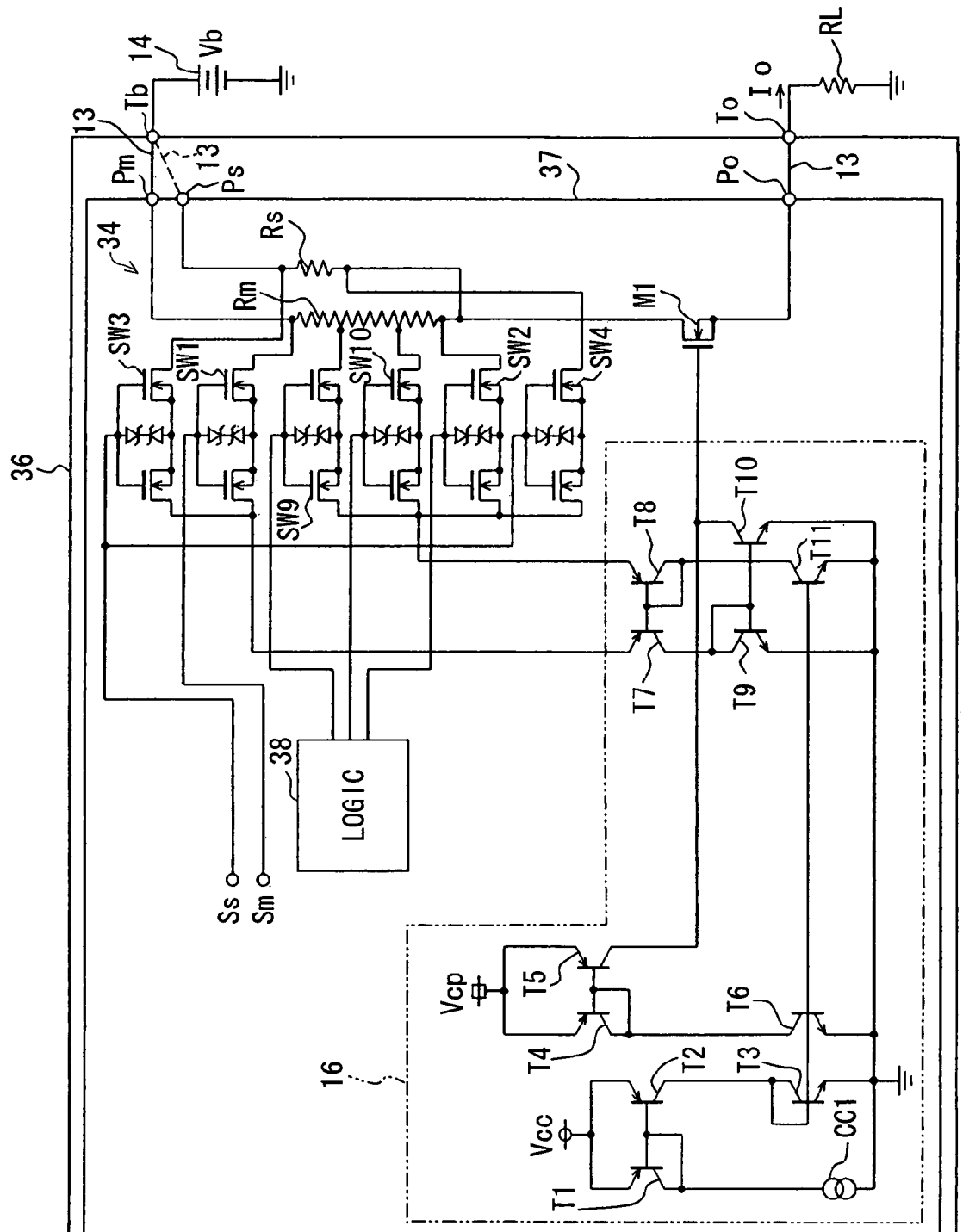
FIG. 13 is a circuit diagram showing a semiconductor integrated circuit device according to an eighth embodiment.

FIG. 13 shows an eighth embodiment mode. In a chip 37 of IC 36, a logic portion 38 (corresponding to a selecting circuit) is formed instead of the resistance circuit 35. This logic portion 38 is constructed from a nonvolatile memory able to be electrically rewritten. An on-off command state of switch circuits SW2, SW9, SW10 is stored to the logic portion 29. Switch circuits SW2, SW9, SW10 are turned on and off by the on-off command signal outputted from the logic portion 38 in accordance with its stored data.

In the wafer inspection, data for turning-off all the switch circuits SW2, SW9, SW10 are stored to the logic portion 38. In the subsequent assembly process, pad Pm and lead electrode Tb are connected, and pad Ps is opened. Further, data for selectively turning-on one of switch circuits SW2, SW9, SW10 are stored to the logic portion 38 on the basis of a result of the wafer inspection. Thus, the resistance value of shunt resistor Rm used as the electric current detecting means at the real using time can be changed to three stages. Further, pad Ps and lead electrode Tb may be also connected in the assembly process to lower the resistance value of the shunt resistor. In this embodiment mode, operations and effects similar to those of the seventh embodiment mode are also obtained.

Ninth Embodiment Mode

Figure 15:
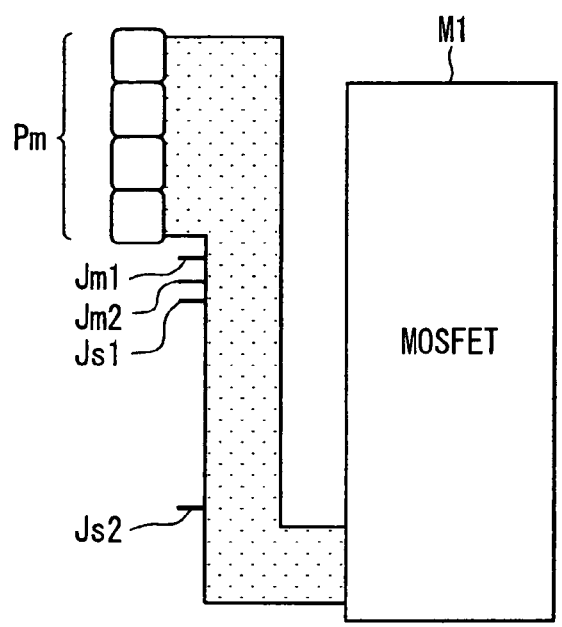
FIG. 15 is a schematic view showing layout of a pad and a shunt resistor according to the ninth embodiment.
Figure 14:
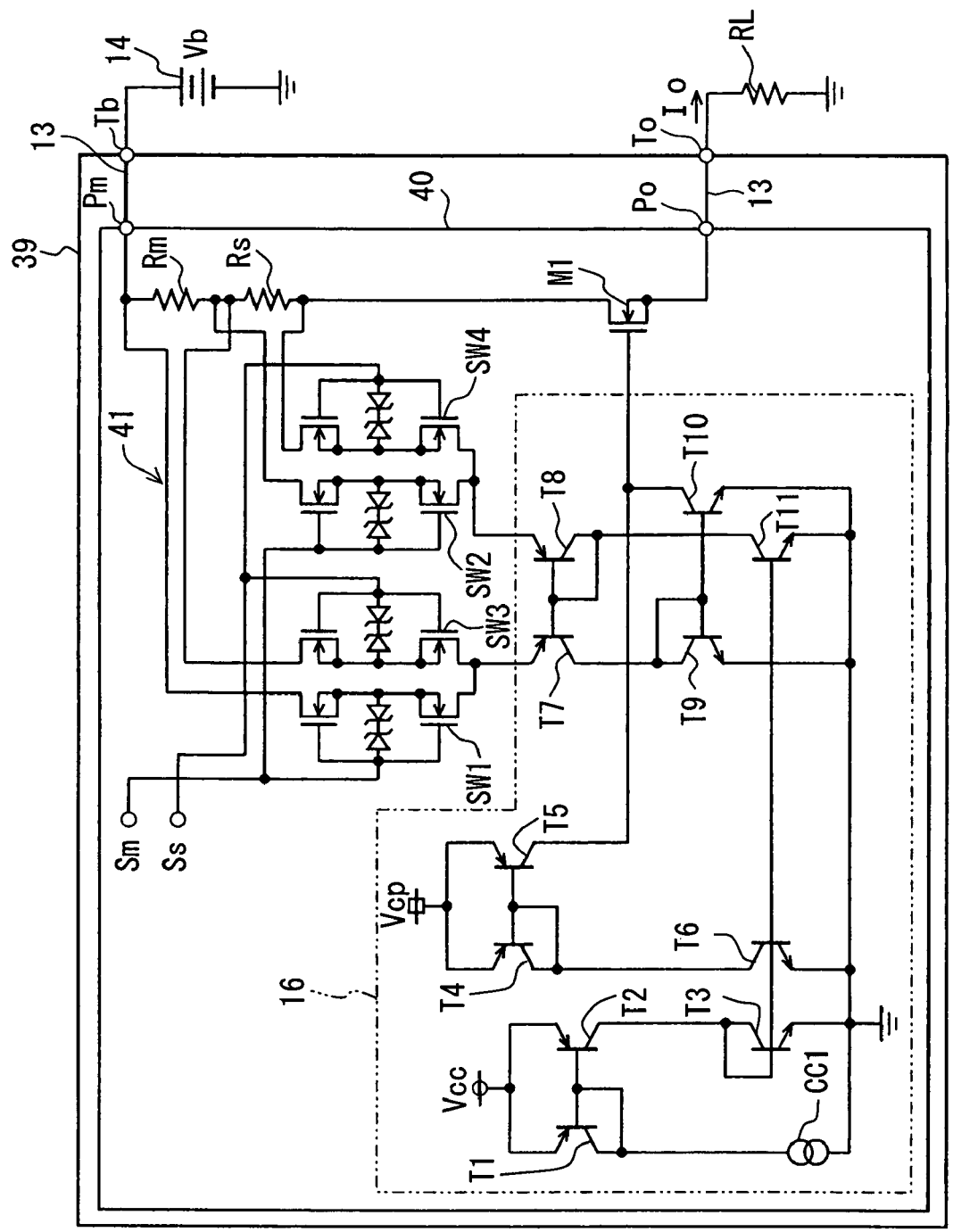
FIG. 14 is a circuit diagram showing a semiconductor integrated circuit device according to a ninth embodiment.

FIGS. 14 and 15 respectively correspond to FIGS. 1 and 2. Pad Pm and lead electrode Tb of a lead frame are connected by bonding using a wire 13. In an electric current control circuit 41 formed in a chip 40 of IC 39, shunt resistor Rm (corresponding to a first resistor) and shunt resistor Rs (corresponding to a second resistor) are connected in series between pad Pm and the drain of MOSFET M1.

FIG. 15 shows a layout example of pad Pm and shunt resistors Rm, Rs. Sensing terminals Jm1, Jm2 as both terminals of shunt resistor Rm, and sensing terminals Js1, Js2 as both terminals of shunt resistor Rs are sequentially formed in an intermediate portion of an aluminum wiring pattern from pad Pm to the drain of MOSFET M1. Since the resistance value of shunt resistor Rs is set to be higher than the resistance value of shunt resistor Rm, the distance of sensing terminals Js1 and Js2 in the aluminum wiring pattern is longer than the distance of sensing terminals Jm1 and Jm2.

Both the terminals (sensing terminals Jm1, Jm2) of shunt resistor Rm are inputted to the control signal generating circuit 16 through switch circuits SW1, SW2. Both the terminals (sensing terminals Js1, Js2) of shunt resistor Rs are inputted to the control signal generating circuit 16 through switch circuits SW3, SW4.

In this construction, at the wafer inspecting time of IC 39, signal Sm attains an L-level and signal Ss attains an H-level. Switch circuits SW1, SW2 are turned off, and switch circuits SW3, SW4 are turned on. At this time, the both-end voltage of shunt resistor Rs is inputted to the control signal generating circuit 16. In contrast to this, at the real using time of manufactured IC 39, signal Sm attains an H-level, and signal Ss attains an L-level. Switch circuits SW1, SW2 are turned on, and switch circuits SW3, SW4 are turned off. At this time, the both-end voltage of shunt resistor Rm is inputted to the control signal generating circuit 16.

In the wafer inspecting process, a probe connected to the electric power source 14 is applied to pad Pm of chip 40, and a probe connected to load RL is applied to pad Po. At this time, electric current Io is flowed from the electric power source 14 to load RL through pad Pm of chip 40, shunt resistors Rm, Rs, MOSFET M1 and pad Po. Constant electric current control is performed on the basis of the both-end voltage of shunt resistor Rs set to be higher than the resistance value of shunt resistor Rm used in the real using state. Accordingly, the electric current control circuit 41 can be normally operated even in an electric current (e.g., several ten mA to several hundred mA) able to be flowed by a probe tester.

On the other hand, at the real using time of IC 39, the constant electric current control is performed on the basis of the both-end voltage of shunt resistor Rm. Accordingly, the constant electric current control is performed with a larger electric current value (e.g., 1.4 A) as a target value. In accordance with this embodiment mode, since the electric current is always flowed through shunt resistors Rm, Rs, loss is slightly increased in comparison with each of the above embodiment modes. However, similar to the first embodiment mode, the constant electric current operation and the output electric current value can be confirmed by a comparatively small electric current able to appropriately execute the wafer inspection.

Tenth Embodiment Mode

Figure 16:
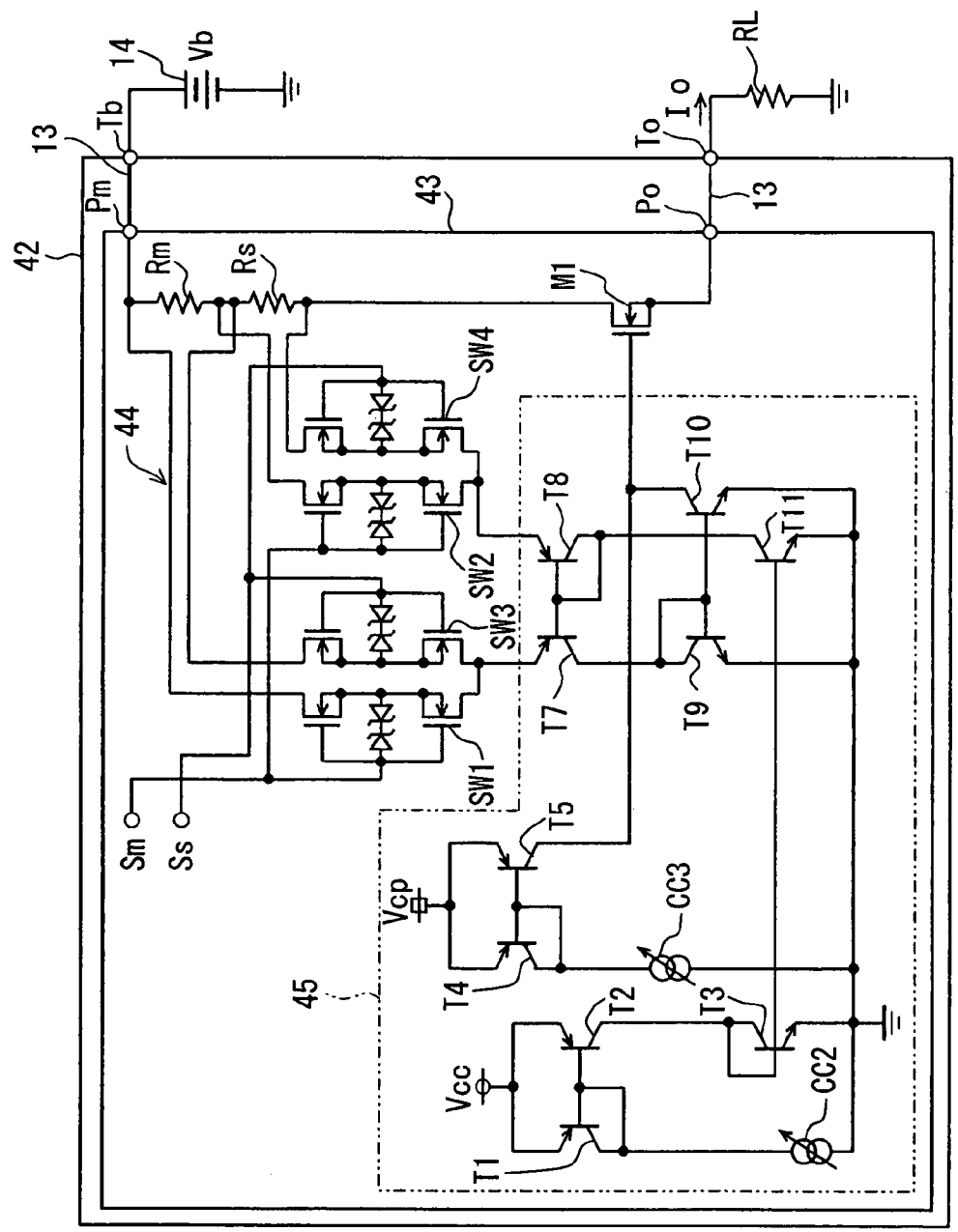
FIG. 16 is a circuit diagram showing a semiconductor integrated circuit device according to a tenth embodiment.

FIG. 16 shows a tenth embodiment mode. An electric current control circuit 44 formed in a chip 43 of IC 42 has a control signal generating circuit 45. In the control signal generating circuit 16 used in each of the above embodiment modes, the control signal generating circuit 45 has a constant electric current circuit CC2 (corresponding to a first constant electric current circuit) able to adjust (trim) an electric current instead of constant electric current circuit CC1. The control signal generating circuit 45 also has a constant electric current circuit CC3 (corresponding to a second constant electric current circuit) able to adjust (trim) an electric current instead of transistor T6. The other constructions are the same as IC 39 shown in FIG. 14.

In control signal generating circuits 16, 45, transistors T7, T8, T9, T10 respectively correspond to first, second, third and fourth transistors, and the base, the emitter and the collector of each transistor respectively correspond to a control terminal, a first main terminal and a second main terminal. The ground corresponds to a predetermined electric power source line.

Output electric current Io is reduced when the electric current value of constant electric current circuit CC2 is increased in a fixing state of the electric current value of constant electric current circuit CC3. Output electric current Io is increased when the electric current value of constant electric current circuit CC2 is reduced. Further, output electric current Io is increased when the electric current value of constant electric current circuit CC3 is increased in a fixing state of the electric current value of constant electric current circuit CC2. Output electric current Io is reduced when the electric current value of constant electric current circuit CC3 is reduced. Thus, the value of output electric current Io can be adjusted by adjusting at least one of the electric current values of constant electric current circuits CC2, CC3.

The resistance values of shunt resistors Rm, Rs are dispersed in accordance with sheet resistance, but shunt resistors Rm, Rs are connected in series in this embodiment mode. Accordingly, differing from the first embodiment mode, etc., no resistance value of the shunt resistor can be adjusted by selecting the existence or nonexistence of parallel connection of shunt resistors Rm and Rs in the assembly process. In contrast to this, in this embodiment mode, the electric current values of constant electric current circuits CC2, CC3 are constructed so as to be adjusted. Accordingly, the output electric current value is finely adjusted in the assembly process, and can be sufficiently adapted with high precision.

Eleventh Embodiment Mode

Figure 17:
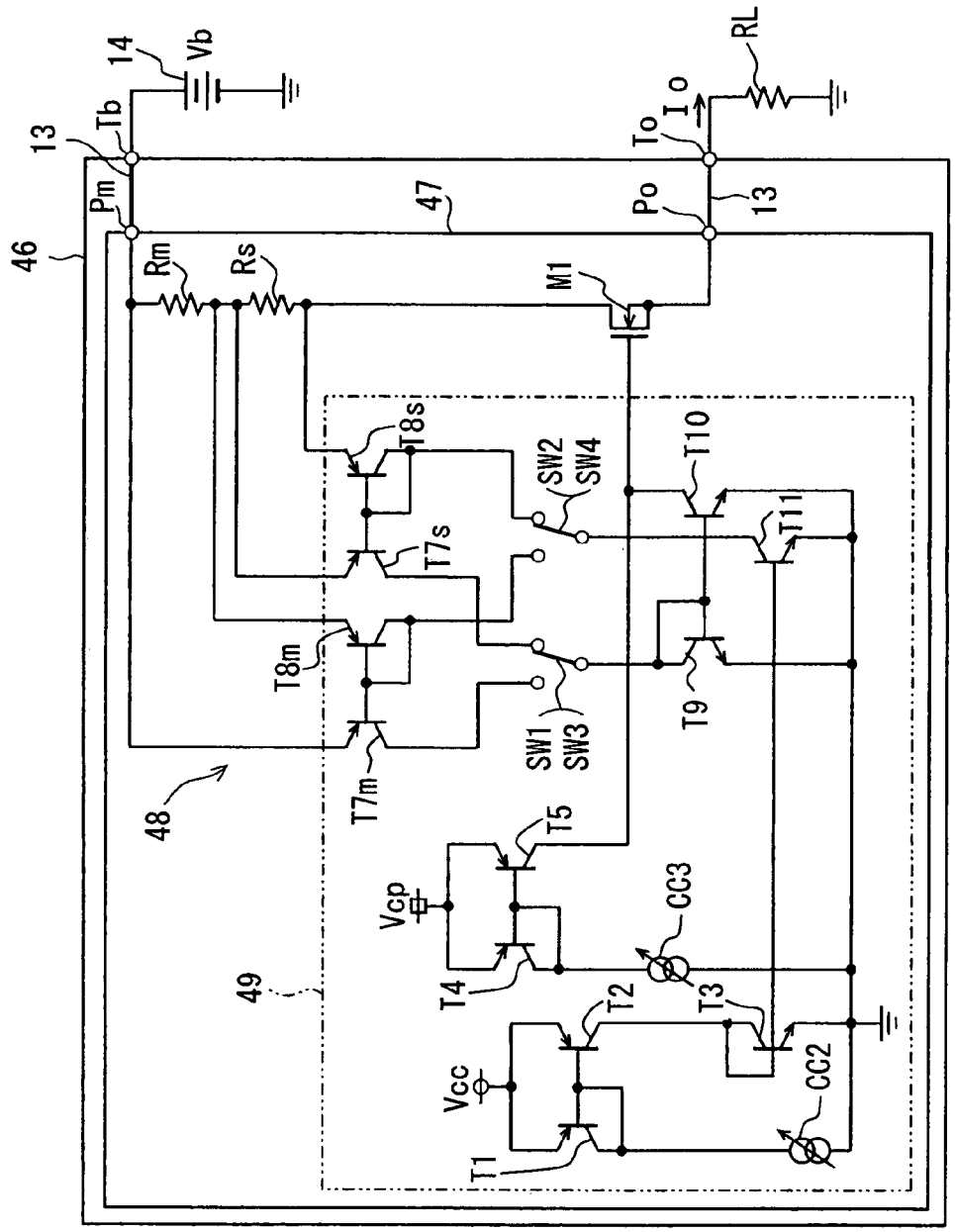
FIG. 17 is a circuit diagram showing a semiconductor integrated circuit device according to an eleventh embodiment.

FIG. 17 shows an eleventh embodiment mode. An electric current control circuit 48 formed in a chip 47 of IC 46 differs from the electric current control circuit 44 shown in FIG. 16 in connecting positions of switch circuits SW1 to SW4. A control signal generating circuit 49 has two sets of transistors T7m, T8m and transistors T7s, T8s corresponding to transistors T7, T8. Each emitter of transistors T7m, T8m is connected to each one terminal of shunt resistor Rm. Each emitter of transistors T7s, T8s is connected to each one terminal of shunt resistor Rs.

Each collector of transistors T7m, T7s (first transistor) is respectively connected to the collector (base) of transistor T9 through switch circuits SW1, SW3. Each collector of transistors T8m, T8s (second transistor) is respectively connected to the collector of transistor T11 through switch circuits SW2, SW4. In FIG. 17, switch circuits SW1 to SW4 are simplified and shown.

When an emitter area ratio of transistor T8x (x=m, s) with respect to transistor T7x (x=m, s) is increased, output electric current Io is increased similarly to a case for reducing the electric current value of constant electric current circuit CC2. Therefore, the emitter area ratio (mirror ratio) of transistor T8s with respect to transistor T7s corresponding to shunt resistor Rs used in electric current detection in the wafer inspecting process is set to be smaller than the emitter area ratio (mirror ratio) of transistor T8m with respect to transistor T7m corresponding to shunt resistor Rm used in the electric current detection in the real using state.

Thus, the electric current control circuit 48 can be normally operated by the electric current able to be flowed by a probe tester in the wafer inspecting process even in a state in which the resistance value of shunt resistor Rs is comparatively lowly set. As its result, an operation using the probe tester can be confirmed in the wafer inspecting process even when the output electric current at the real using time is large. Further, in accordance with this conformation, the resistance value of shunt resistor Rs is lowered so that electric power loss in shunt resistor Rs at the real using time can be reduced.

Twelfth Embodiment Mode

Figure 18:
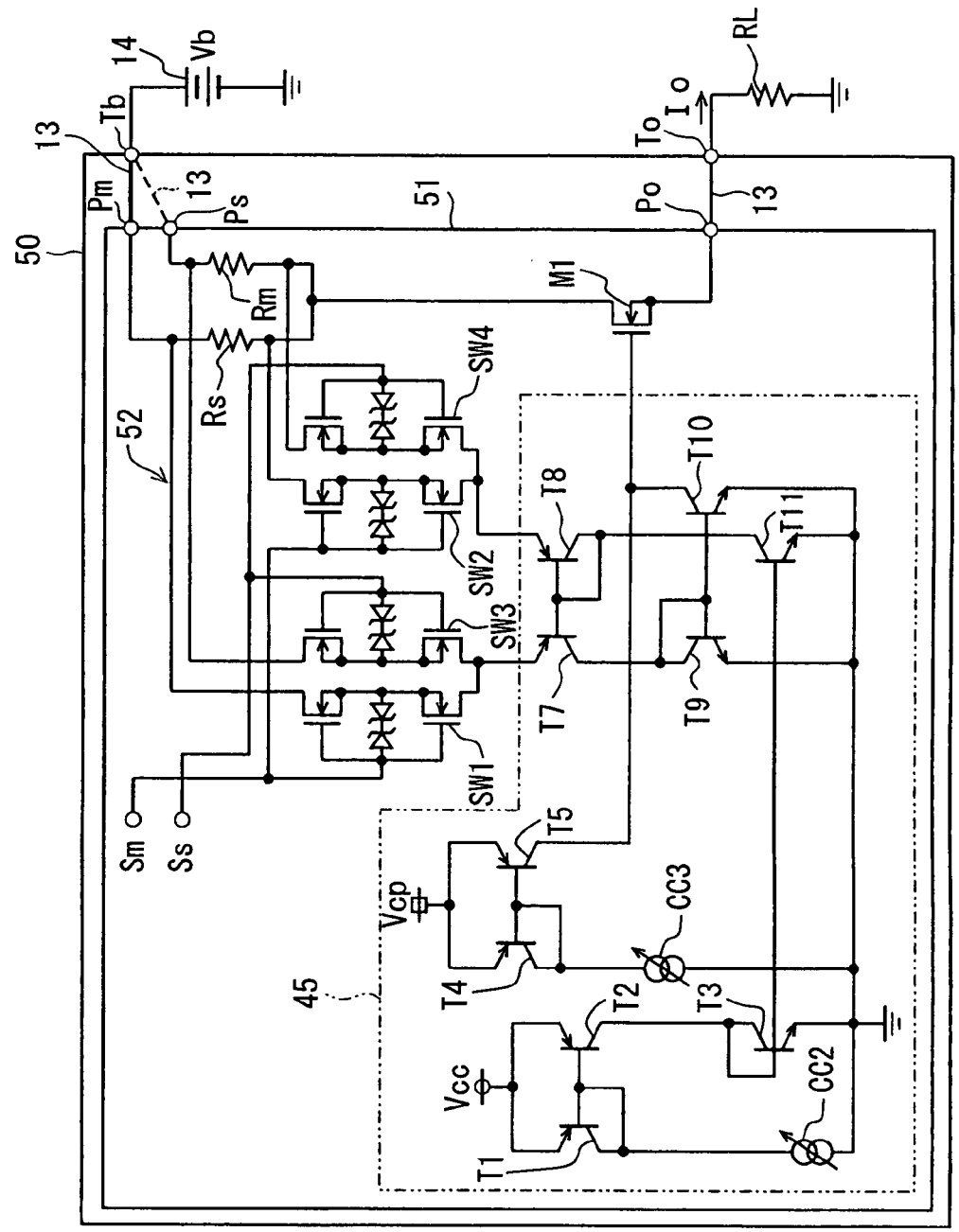
FIG. 18 is a circuit diagram showing a semiconductor integrated circuit device according to a twelfth embodiment.

FIG. 18 shows an twelfth embodiment mode. In an electric current control circuit 52 formed in a chip 51 of IC 50, the control signal generating circuit 16 in FIG. 1 is replaced with the control signal generating circuit 45 shown in FIG. 16.

In accordance with this embodiment mode, as mentioned above, the resistance value of the shunt resistor can be adjusted to two stages and the output electric current value can be sufficiently adapted by selecting the existence or non-existence of connection of lead electrode Tb and pad Ps connected to shunt resistor Rs in the assembly process. Further, since the electric current values of constant electric current circuits CC2, CC3 are constructed so as to be adjusted, the output electric current value can be sufficiently adapted with high precision in the assembly process, and an air bag can be more reliably developed in accordance with an ignition command signal.

Thirteenth Embodiment Mode

Figure 19:
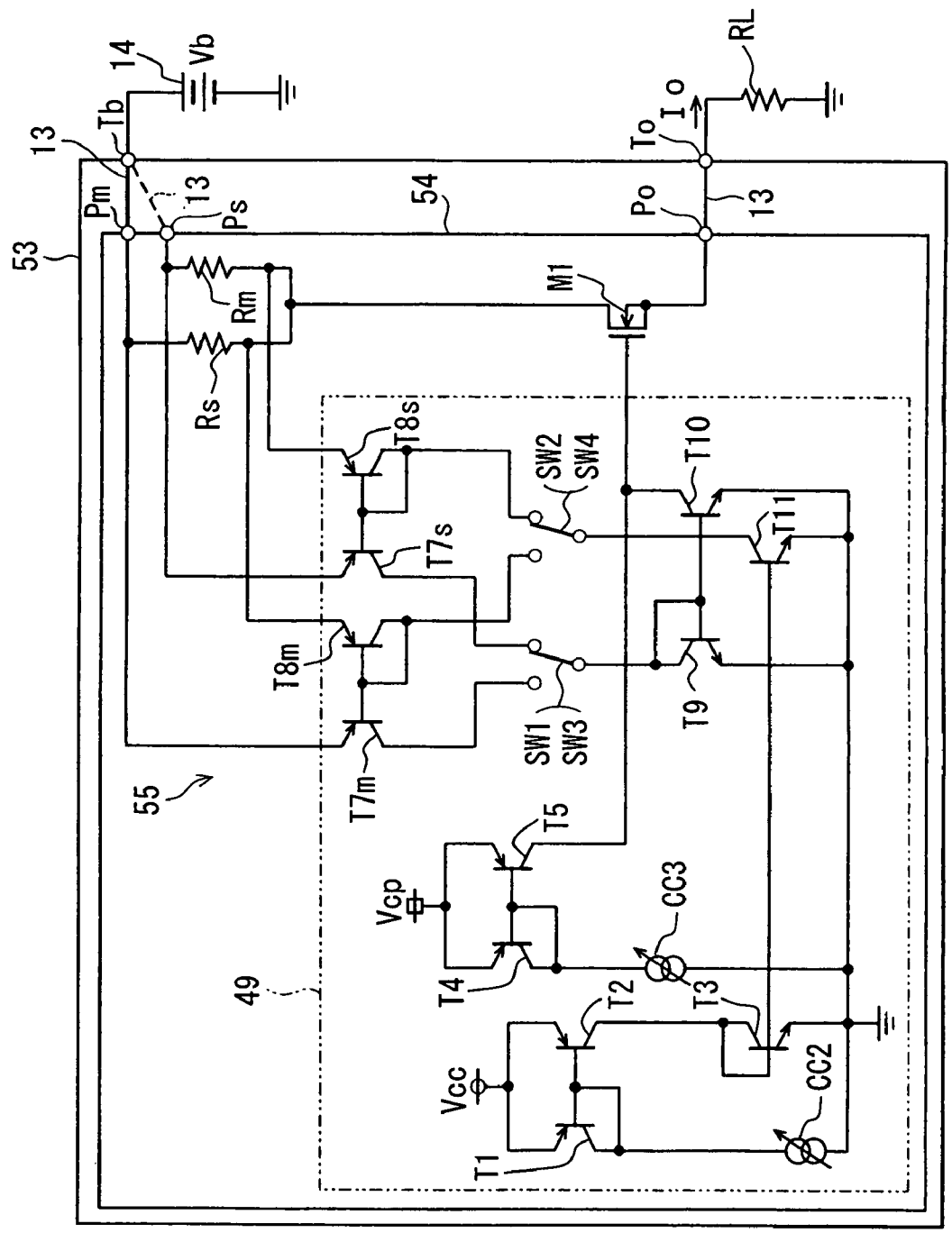
FIG. 19 is a circuit diagram showing a semiconductor integrated circuit device according to a thirteenth embodiment.
Figure 20:
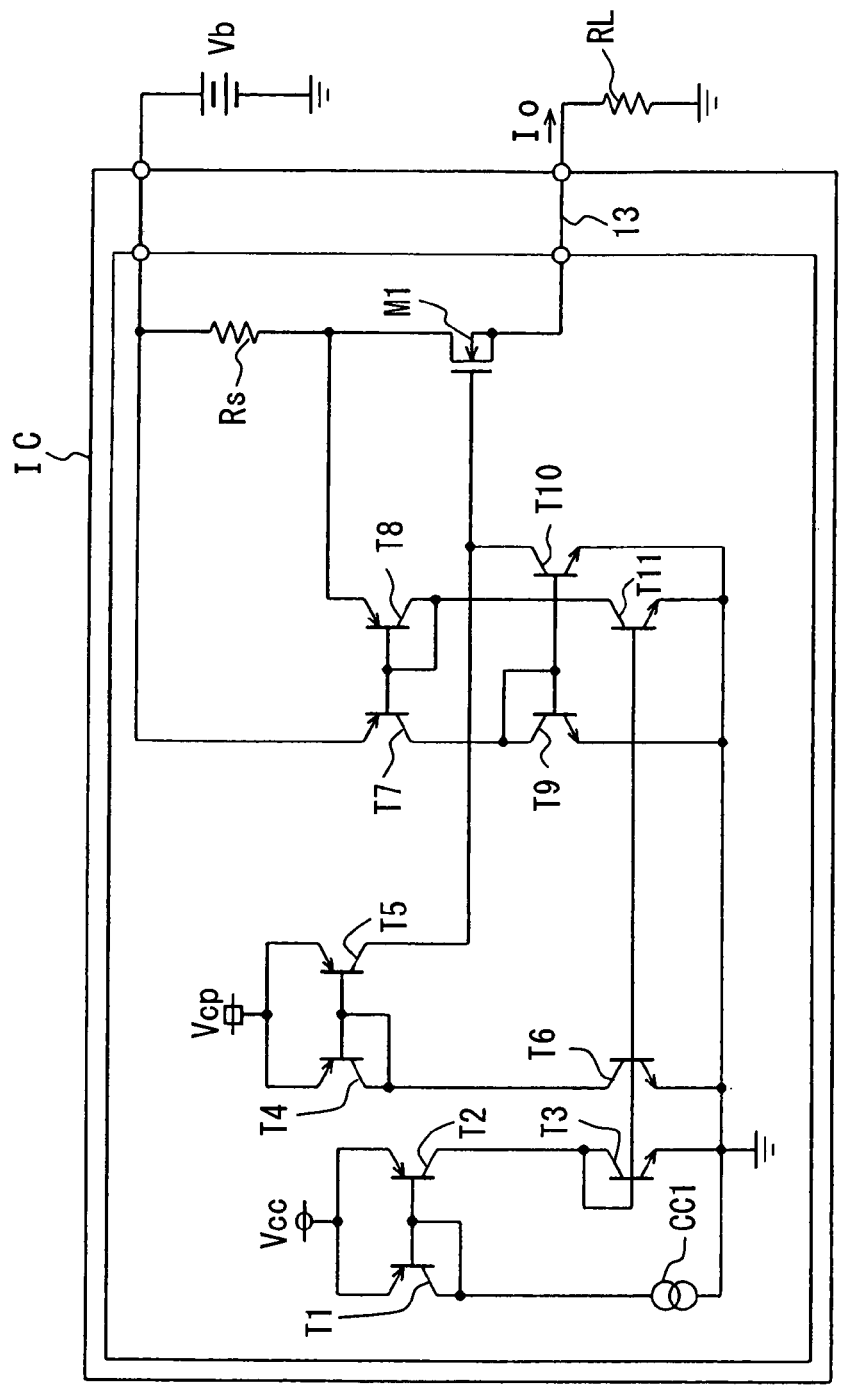
FIG. 20 is a circuit diagram showing a semiconductor integrated circuit device according to a prior art.

FIG. 19 shows a thirteenth embodiment mode. In an electric current control circuit 55 formed in a chip 54 of IC 53, the control signal generating circuit 49 shown in FIG. 17 is applied to the construction shown in FIG. 18. In this embodiment mode, the emitter area ratio of transistor T8s with respect to transistor T7s corresponding to shunt resistor Rs is also set to be smaller than the emitter area ratio of transistor T8m with respect to transistor T7m corresponding to shunt resistor Rm. Thus, an operation using a probe tester can be confirmed in the wafer inspecting process even when the output electric current at the real using time is larger.

Other Embodiment Modes

In the third to sixth and twelfth embodiment modes, similar to the second embodiment mode, switch circuits SW2, SW4 may be also commonized.

In the third embodiment mode, the number of series circuits of the second pad and the second resistor is not limited to two, but may be also set to one or three or more.

In the fourth to sixth embodiment modes, the number of series circuits of the third switch circuit and the third resistor connected between pad Pm and the drain of MOSFET M1 is not limited to two, but may be also set to one or three or more.

In the seventh and eighth embodiment modes, switch circuits SW2, SW9, SW10 may be also constructed so as to be controlled by an on-off command signal given from the exterior of IC. Further, in shunt resistor Rm, the number of intermediate positions of the aluminum wiring pattern for taking-out a voltage signal is not limited to two, but may be also set to one or three or more.

In the ninth, tenth and eleventh embodiment modes, another element, e.g., another resistor may be also connected in addition to shunt resistors Rm and Rs between pad Pm and the drain of MOSFET M1.

In the first to eighth embodiment modes, constant electric current circuit CC1 may be also replaced with constant electric current circuit CC2 able to adjust the electric current. Further, the control signal generating circuit 16 may be also replaced with the control signal generating circuit 45. In this case and the tenth to thirteenth embodiment modes, only one of constant electric current circuits CC2, CC3 may be also constructed so as to adjust the electric current.

The respective embodiment modes may be also constructed so as to be suitably combined.

The electric current control circuit may be also constructed by a MOS transistor. In this case, the gate, the source and the drain of the MOS transistor respectively correspond to the control terminal, the first main terminal and the second main terminal.

The electric current control circuit formed in IC of each embodiment mode is the constant electric current control circuit. However, it is sufficient if it is a circuit using the shunt resistor as the electric current detecting means and controlling the electric current.

MOSFET M1 may be also arranged outside the chip. Further, it may be also set to low side connection. The pad (electrode pad) and the lead electrode may be also connected by using a means except for the wire bonding.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate;
   an output transistor; and
   a current control circuit for controlling an output current of the output transistor, wherein
   the current control circuit is disposed on the substrate,
   the substrate includes a first pad and a second pad,
   the current control circuit includes a first resistor, a second resistor, a control signal generation circuit, a first switching circuit, and a second switching circuit,
   the first resistor is disposed between the first pad and the output transistor,
   the second resistor is disposed between the second pad and the output transistor, and has a resistance higher than the first resistor,
   the control signal generation circuit generates a control signal to the output transistor based on one of a voltage of both ends of the first resistor and a voltage of both ends of the second resistor,
   the first switching circuit is disposed between both ends of the first resistor and the control signal generation circuit,
   the second switching circuit is disposed between both ends of the second resistor and the control signal generation circuit, and
   the first switching circuit or the second switching circuit is controlled to be in an on-state.

2. The device according to claim 1, wherein
   the second pad includes a plurality of second pad elements,
   the second resistor includes a plurality of second resistor elements,
   each second resistor element is disposed between the second pad element and the output transistor, and
   the second switching circuit is disposed between both ends of one of the second resistor elements and the control signal generation circuit.

3. The device according to claim 1, wherein
   the current control circuit further includes:
     a third resistor disposed between the first pad and the output transistor and having a resistance higher than the first resistor;
     a third switching circuit coupled in series with the third resistor; and
     a fourth switching circuit coupled in series with the second resistor, and
   the third switching circuit and the fourth switching circuit are independently controlled to switch between an on-state and an off-state.

4. The device according to claim 3, wherein
   the third resistor includes a plurality of third resistor elements,
   the third switching circuit includes a plurality of third switching devices,
   each third resistor element is disposed between the first pad and the output transistor, and has a resistance higher than the first resistor, and
   each third switching circuit device couples in series with the third resistor element.

5. The device according to claim 3, wherein
   the current control circuit further includes a selection circuit,
   the selection circuit includes a first trimming resistor corresponding to the third switching circuit and a second trimming resistor corresponding to the fourth switching circuit,
   the selection circuit outputs an on-state instruction signal to the third switching circuit in a case where the first trimming resistor is cut off, and
   the selection circuit outputs another on-state instruction signal to the fourth switching circuit in a case where the second trimming resistor is cut off.

6. The device according to claim 3, wherein
   the current control circuit further includes a selection circuit,
   the selection circuit is capable of memorizing an on-off instruction state of each of the third and fourth switching circuits, and
   the selection circuit outputs an instruction signal corresponding to the on-off instruction state to each of the third and fourth switching circuits.

7. The device according to claim 1, wherein
   the first switching circuit includes a pad side first switching device and an output transistor side first switching device,
   the second switching circuit includes a pad side second switching device and an output transistor side second switching device,
   the pad side first switching device is disposed between a pad side first end of the first resistor and the control signal generation circuit,
   the output transistor side first switching device is disposed between an output transistor side first end of the first resistor and the control signal generation circuit,
   the pad side second switching device is disposed between a pad side second end of the second resistor and the control signal generation circuit, and
   the output transistor side second switching device is disposed between an output transistor side second end of the second resistor and the control signal generation circuit.

8. The device according to claim 7, wherein
   the output transistor side first switching device and the output transistor side second switching device are provided by a common output transistor side switching device.

9. The device according to claim 1, wherein
   the first resistor and the second resistor disposed on the semiconductor substrate are arranged side by side to direct a same direction.

10. The device according to claim 1, wherein
    the control signal generation circuit includes:
      a first transistor having a first terminal, a second terminal and a control terminal;
      a second transistor having a first terminal, a second terminal and a control terminal;
      a third transistor having a first terminal, a second terminal and a control terminal;
      a fourth transistor having a first terminal, a second terminal and a control terminal;
      a first constant current circuit;
      a second constant current circuit; and
      a predetermined power source line,
    the first terminal of the first transistor is coupled with a pad side first end of the first resistor through the first switching circuit or a pad side second end of the second resistor through the second switching circuit,
    the control terminal of the first transistor is coupled with the control terminal of the second transistor,
    the first terminal of the second transistor is coupled with an output transistor side first end of the first resistor through the first switching circuit, or an output transistor side second end of the second resistor through the second switching circuit, the first terminal and the second terminal of the third transistor are coupled between the second terminal of the first transistor and the power source line, the control terminal of the third transistor is coupled with the control terminal of the fourth transistor, the first terminal and the second terminal of the fourth transistor are coupled between a control terminal of the output transistor and the power source line, the first constant current circuit is capable of flowing a first current to the second transistor, and the second constant current circuit is capable of flowing a second current to the fourth transistor through the control terminal of the output transistor.

11. A semiconductor device comprising:

a semiconductor substrate;

an output transistor; and a current control circuit for controlling an output current of the output transistor, wherein the current control circuit is disposed on the substrate, the substrate includes a first pad and a second pad, the current control circuit includes a first resistor, a second resistor, a control signal generation circuit, a first switching circuit and a second switching circuit, the first resistor is disposed between the first pad and the output transistor, the first resistor has a full voltage between both ends of the first resistor and a partial voltage between a middle portion of the first resistor and one end of the first resistor, the full voltage and the partial voltage being retrievable, the second resistor is disposed between the second pad and the output transistor, and has a resistance higher than the first resistor, the control signal generation circuit generates a control signal to the output transistor based on one of the full voltage or the partial voltage of the first resistor and a voltage of both ends of the second resistor, the first switching circuit includes a pad side first switching device, a middle portion first switching device, and an output transistor side first switching device, the pad side first switching device is disposed between a pad side first end of the first resistor and the control signal generation circuit, the middle portion first switching device is disposed between the middle portion of the first resistor and the control signal generation circuit, the output transistor side first switching device is disposed between an output transistor side first end of the first resistor and the control signal generation circuit, the second switching circuit is disposed between both ends of the second resistor and the control signal generation circuit, the pad side first switching device or the second switching circuit is controlled to be in an on-state, and the output transistor side first switching device and the middle portion switching device are independently controlled to switch between an on-state and an off-state.

12. The device according to claim 11, wherein the middle portion includes a plurality of middle sections so that a plurality of partial voltages between the middle sections and the one end of the first resistor are retrievable, the middle portion first switching device includes a plurality of middle portion first switching elements, and each middle portion first switching element is disposed between the middle section of the first resistor and the control signal generation circuit.

13. The device according to claim 11, wherein the current control circuit further includes a selection circuit, the selection circuit includes a first trimming resistor corresponding to the pad side first switching device, a second trimming resistor corresponding to the middle portion first switching device, a third trimming resistor corresponding to the output transistor side first switching device, the selection circuit outputs an on-state instruction signal to the pad side first switching device in a case where the first trimming resistor is cut off, the selection circuit outputs another on-state instruction signal to the middle portion switching device in a case where the second trimming resistor is cut off, and the selection circuit outputs further another on-state instruction signal to the output transistor side first switching device in a case where the third trimming resistor is cut off.

14. The device according to claim 11, wherein the current control circuit further includes a selection circuit, the selection circuit is capable of memorizing an on-off instruction state of each of the pad side first switching device, the middle portion first switching device and the output transistor side first switching device, and the selection circuit outputs an instruction signal corresponding to the on-off instruction state to each of the pad side first switching device, the middle portion first switching device and the output transistor side first switching device.

15. The device according to claim 11, wherein the first resistor and the second resistor disposed on the semiconductor substrate are arranged side by side to direct a same direction.

16. A semiconductor device comprising:

a semiconductor substrate;

an output transistor; and a current control circuit for controlling an output current of the output transistor, wherein the current control circuit is disposed on the substrate, the substrate includes a pad, the current control circuit includes a first resistor, a second resistor, a control signal generation circuit, a first switching circuit and a second switching circuit, the first resistor and the second resistor are disposed in series between the pad and the output transistor, the second resistor has a resistance higher than the first resistor, the control signal generation circuit generates a control signal to the output transistor based on one of a voltage of both ends of the first resistor and a voltage of both ends of the second resistor, the first switching circuit is disposed between both ends of the first resistor and the control signal generation circuit, the second switching circuit is disposed between both ends of the second resistor and the control signal generation circuit, and the first switching circuit or the second switching circuit is controlled to be in an on-state.

17. The device according to claim 16, wherein the control signal generation circuit includes:

a first transistor having a first terminal, a second terminal and a control terminal;

a second transistor having a first terminal, a second terminal and a control terminal;

a third transistor having a first terminal, a second terminal and a control terminal;

a fourth transistor having a first terminal, a second terminal and a control terminal;

a first constant current circuit;

a second constant current circuit; and a predetermined power source line, the first terminal of the first transistor is coupled with a pad side first end of the first resistor or a pad side second end of the second resistor, the control terminal of the first transistor is coupled with the control terminal of the second transistor, the first terminal of the second transistor is coupled with an output transistor side first end of the first resistor or an output transistor side second end of the second resistor, the first terminal and the second terminal of the third transistor are coupled between the second terminal of the first transistor and the power source line, the control terminal of the third transistor is coupled with the control terminal of the fourth transistor, the first terminal and the second terminal of the fourth transistor are coupled between a control terminal of the output transistor and the power source line, the first constant current circuit is capable of flowing a first current to the second transistor, and the second constant current circuit is capable of flowing a second current to the fourth transistor through the control terminal of the output transistor.

18. The device according to claim 16, wherein at least one of the first constant current circuit and the second constant current circuit is capable of adjusting the first or second current.

19. A semiconductor device comprising:

a semiconductor substrate;

an output transistor; and a current control circuit for controlling an output current of the output transistor, wherein the current control circuit is disposed on the substrate, the substrate includes a pad, the current control circuit includes a first resistor, a second resistor, and a control signal generation circuit, the first resistor and the second resistor are disposed in series between the pad and the output transistor, the second resistor has a resistance higher than the first resistor, the control signal generation circuit generates a control signal to the output transistor based on one of a voltage of both ends of the first resistor and a voltage of both ends of the second resistor, the control signal generation circuit includes:

a first resistor side first transistor having a first terminal, a second terminal and a control terminal;

a second resistor side first transistor having a first terminal, a second terminal and a control terminal;

a first resistor side second transistor having a first terminal, a second terminal and a control terminal;

a second resistor side second transistor having a first terminal, a second terminal and a control terminal;

a third transistor having a first terminal, a second terminal and a control terminal;

a fourth transistor having a first terminal, a second terminal and a control terminal;

a first constant current circuit;

a second constant current circuit; and a predetermined power source line, the first terminal of the first resistor side first transistor is coupled with a pad side first end of the first resistor, the first terminal of the second resistor side first transistor is coupled with a pad side second end of the second resistor, the first terminal of the first resistor side second transistor is coupled with an output transistor side first end of the first resistor, the first terminal of the second resistor side second transistor is coupled with an output transistor side second end of the second resistor, the control terminal of the first resistor side first transistor is coupled with the control terminal of the first resistor side second transistor, the control terminal of the second resistor side first transistor is coupled with the control terminal of the second resistor side second transistor, the first switching circuit is disposed between the first resistor side first transistor and the third transistor, and further, disposed between the first resistor side second transistor and the third transistor, the second switching circuit is disposed between the second resistor side first transistor and the fourth transistor, and further, disposed between the second resistor side second transistor and the fourth transistor, the first switching circuit or the second switching circuit is controlled to be in an on-state, the first terminal and the second terminal of the third transistor are coupled between the first switching circuit and the power source line, the control terminal of the third transistor is coupled with the control terminal of the fourth transistor, the first terminal and the second terminal of the fourth transistor are coupled between a control terminal of the output transistor and the power source line, the first constant current circuit is capable of flowing a first current to the first resistor side second transistor and the second resistor side second transistor, and the second constant current circuit is capable of flowing a second current to the fourth transistor through the control terminal of the output transistor.

20. The device according to claim 19, wherein a current ratio between the second resistor side second transistor and the second resistor side first transistor is smaller than a current ratio between the first resistor side second transistor and the first resistor side first transistor.

21. The device according to claim 19, wherein at least one of the first constant current circuit and the second constant current circuit is capable of adjusting the first or second current.

22. A semiconductor device comprising:

a semiconductor substrate;

an output transistor; and a current control circuit for controlling an output current of the output transistor, wherein the current control circuit is disposed on the substrate, the substrate includes a first pad and a second pad, the current control circuit includes a first resistor, a second resistor, and a control signal generation circuit, the first resistor is disposed between the first pad and the output transistor, the second resistor is disposed between the second pad and the output transistor, and has a resistance higher than the first resistor, the control signal generation circuit generates a control signal to the output transistor based on one of a voltage of both ends of the first resistor and a voltage of both ends of the second resistor, the control signal generation circuit includes:
- a first resistor side first transistor having a first terminal, a second terminal and a control terminal;
- a second resistor side first transistor having a first terminal, a second terminal and a control terminal;
- a first resistor side second transistor having a first terminal, a second terminal and a control terminal;
- a second resistor side second transistor having a first terminal, a second terminal and a control terminal;
- a third transistor having a first terminal, a second terminal and a control terminal;
- a fourth transistor having a first terminal, a second terminal and a control terminal;
- a first constant current circuit;
- a second constant current circuit; and
- a predetermined power source line, the first terminal of the first resistor side first transistor is coupled with a pad side first end of the first resistor, the first terminal of the second resistor side first transistor is coupled with a pad side second end of the second resistor, the first terminal of the first resistor side second transistor is coupled with an output transistor side first end of the first resistor, the first terminal of the second resistor side second transistor is coupled with an output transistor side second end of the second resistor, the control terminal of the first resistor side first transistor is coupled with the control terminal of the first resistor side second transistor, the control terminal of the second resistor side first transistor is coupled with the control terminal of the second resistor side second transistor, the first switching circuit is disposed between the first resistor side first transistor and the third transistor, and further, disposed between the first resistor side second transistor and the third transistor, the second switching circuit is disposed between the second resistor side first transistor and the fourth transistor, and further, disposed between the second resistor side second transistor and the fourth transistor, the first switching circuit or the second switching circuit is controlled to be in an on-state, the first terminal and the second terminal of the third transistor are coupled between the first switching circuit and the power source line, the control terminal of the third transistor is coupled with the control terminal of the fourth transistor, the first terminal and the second terminal of the fourth transistor are coupled between a control terminal of the output transistor and the power source line, the first constant current circuit is capable of flowing a first current to the first resistor side second transistor and the second resistor side second transistor, and the second constant current circuit is capable of flowing a second current to the fourth transistor through the control terminal of the output transistor.

23. The device according to claim 22, wherein a current ratio between the second resistor side second transistor and the second resistor side first transistor is smaller than a current ratio between the first resistor side second transistor and the first resistor side first transistor.

24. The device according to claim 22, wherein at least one of the first constant current circuit and the second constant current circuit is capable of adjusting the first or second current.

\* \* \* \* \*